United States Patent
Kamiyama et al.

(10) Patent No.: US 7,461,912 B2
(45) Date of Patent: Dec. 9, 2008

(54) DEVICE MANUFACTURING APPARATUS, DEVICE MANUFACTURING METHOD, AND ELECTRONIC EQUIPMENT

(75) Inventors: Nobuaki Kamiyama, Nagano-ken (JP); Hayato Takahashi, Chino (JP)

(73) Assignee: Seiko Epson Corporation (JP)

( * ) Notice: Subject to any disclaimer, the term of this patent is extended or adjusted under 35 U.S.C. 154(b) by 135 days.

(21) Appl. No.: 10/691,464

(22) Filed: Oct. 22, 2003

(65) Prior Publication Data

US 2004/0135830 A1 Jul. 15, 2004

(30) Foreign Application Priority Data

Oct. 24, 2002 (JP) ............... 2002-309584
Aug. 26, 2003 (JP) ............... 2003-301295

(51) Int. Cl.
B41J 29/38 (2006.01)
B41J 29/393 (2006.01)
B41J 23/00 (2006.01)

(52) U.S. Cl. ................ 347/19; 347/9; 347/37
(58) Field of Classification Search .......... 347/9, 347/19, 37, 104
See application file for complete search history.

(56) References Cited

U.S. PATENT DOCUMENTS

| | | | | |
|---|---|---|---|---|
| 5,216,442 | A * | 6/1993 | Parks et al. ................ | 346/134 |
| 6,357,849 | B2 * | 3/2002 | Takizawa et al. ............ | 347/19 |
| 6,371,590 | B1 * | 4/2002 | Hah ........................... | 347/19 |
| 6,517,184 | B1 | 2/2003 | Bruch et al. | |
| 6,551,521 | B1 * | 4/2003 | Culpovich et al. .......... | 216/84 |
| 6,565,179 | B1 | 5/2003 | Bruch et al. | |
| 6,814,422 | B2 * | 11/2004 | Bruch et al. ................ | 347/23 |
| 6,832,825 | B1 | 12/2004 | Nishikori et al. | |
| 2002/0140750 | A1 * | 10/2002 | Yoshiyama et al. ........... | 347/7 |
| 2002/0149660 | A1 * | 10/2002 | Cleary et al. ............... | 347/102 |

FOREIGN PATENT DOCUMENTS

| | | |
|---|---|---|
| JP | 04-269549 | 9/1992 |
| JP | 08-281174 | 10/1996 |
| JP | 11-014820 | 1/1999 |
| JP | 11-188853 | 7/1999 |
| JP | 2000-048716 | 2/2000 |
| JP | 2000-238274 | 9/2000 |
| JP | 2000-284113 | 10/2000 |

(Continued)

OTHER PUBLICATIONS

Patent Abstract of Japan 2002-192740 (2 pages).

(Continued)

*Primary Examiner*—Matthew Luu
*Assistant Examiner*—Jannelle M Lebron
(74) *Attorney, Agent, or Firm*—Harness, Dickey & Pierce, P.L.C.

(57) ABSTRACT

A device manufacturing apparatus includes a discharge head discharging a droplet containing a functional material, a stage supporting a substrate on which the droplet is discharged, and which is capable of moving relative to the discharge head, a carrier carrying the substrate, a detector detecting a discharge condition of the droplet which is discharged from a discharge nozzle formed in the discharge head, and a controller executing a detection operation by the discharge device during a carrying operation of the substrate.

8 Claims, 17 Drawing Sheets

FOREIGN PATENT DOCUMENTS

| | | |
|---|---|---|
| JP | 2000-343686 | 12/2000 |
| JP | 2001-015022 | 1/2001 |
| JP | 2001-027604 | 1/2001 |
| JP | 2001-105578 | 4/2001 |
| JP | 2001-212970 | 8/2001 |
| JP | 2002-079693 | 3/2002 |
| JP | 2002-192740 | 7/2002 |

OTHER PUBLICATIONS

Patent Abstract of Japan 2002-079693 (2 pages).
Patent Abstract of Japan 2001-212970 (2 pages).
Patent Abstract of Japan 2000-343686 (2 pages).
Communication from Korean Patent Office regarding counterpart application.
Communication from Japanese Patent Office regarding related application.

* cited by examiner

FIG. 15A
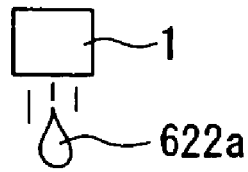
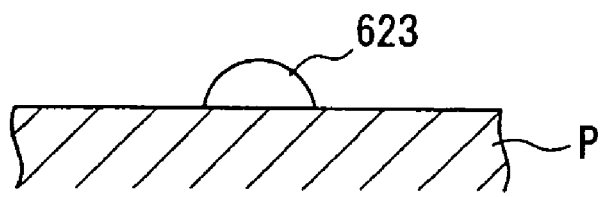
FIG. 15B
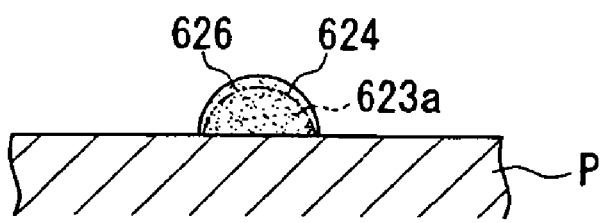
FIG. 15C
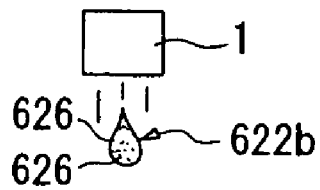
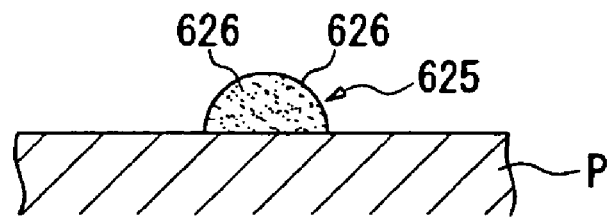
FIG. 15D

DEVICE MANUFACTURING APPARATUS, DEVICE MANUFACTURING METHOD, AND ELECTRONIC EQUIPMENT

BACKGROUND OF THE INVENTION

1. Field of the Invention

The present invention relates to a device manufacturing apparatus and a device manufacturing method provided with a discharge head capable of discharging a droplet.

Priority is claimed to Japanese Patent Applications No. 2002-309584, filed Oct. 24, 2002, and No. 2003-301295, filed Aug. 26, 2003, which are incorporated herein by reference.

2. Description of Related Art

Heretofore, photolithographic methods are used, primarily, for manufacturing devices with fine patterns. However, in recent years, attention has been given to a device manufacturing method using a droplet discharge system. In this technique, liquid material containing functional material is discharged from a discharge head in a droplet discharge apparatus, placing the material on a substrate in order to form a pattern, and it is very effective from the standpoint of handling diversified small-quantity production. For a droplet discharge system in a droplet discharge apparatus, generally known systems are a piezo jet system in which a droplet of liquid material is discharged by the distortion of a piezoelectric element, or a method in which liquid material is discharged by the rapid generation of steam due to the application of heat.

A discharge head has a plurality of discharge nozzles. However, sometimes liquid material cannot be discharged from some of the discharge nozzles because of clogging, or the like, for example. If there is a discharge nozzle (non-performing nozzle) that cannot discharge liquid, then dots will be missing when a dot pattern is formed by discharging droplets onto a substrate.

The techniques disclosed in the abovementioned patent literature are techniques related to a non-performing nozzle detection method applicable to a printer. Since the print operation by a printer is not one which is carried out regularly, it is normal for the non-performing nozzle detection operation to be carried out prior to starting the print operation. On the other hand, the discharge operation which discharges liquid from a discharge head in order to manufacture a device is for example carried out all day long inside a factory. Consequently, when manufacturing a device using a droplet discharge method, setting the timing for the non-performing nozzle detection operation to an optimum, is effective in improving the productivity (throughput) for the device.

The present invention takes such conditions into consideration, with an object of providing a device manufacturing apparatus and device manufacturing method which can perform detection of non-performing nozzles without a decrease in throughput, and manufacture devices having a desirable performance without missing dots, when manufacturing a device using a droplet discharge method.

SUMMARY OF THE INVENTION

A first aspect of the present invention is a device manufacturing apparatus has a discharge head for discharging a droplet containing a functional material, a stage for supporting a substrate on which the droplet is discharged, and which is capable of moving relative to the discharge head, a carrier for carrying the substrate, a detector for detecting a discharge condition of the droplet which is discharged from a discharge nozzle formed in the discharge head, and a controller for executing a detection operation by the discharge device during a carrying operation of the substrate.

Furthermore, a second aspect of the present invention is a device manufacturing method has a step of discharging a droplet containing a functional material onto a substrate by means of a discharge nozzle in a discharge head, a carrying step of carrying the substrate, and a detection step of detecting a discharge condition of the droplet which is discharged from the discharge nozzle, during a carrying operation of the substrate.

According to the above-mentioned aspects, while carrying the substrate for manufacturing a device, to the stage, that is to say, while performing the operation of carrying the substrate to and from (loading and unloading) the stage, the non-performing nozzle detection operation which detects whether or not the droplet is being discharged from the discharge nozzle is performed. Therefore the carrying operation for the substrate and the detection operation for the non-performing nozzle can be carried out in parallel.

Consequently, the non-performing nozzle detection operation can be carried out without interfering with the discharge operation which discharges the droplet onto the substrate in order to manufacture the device. Therefore a device having a desirable performance without missing dots can be manufactured without a decrease in throughput. Furthermore, during the loading and unloading operation of the substrate, the time out of that for the overall device manufacturing process, for discharging the droplet from the discharge nozzle is comparatively long. Therefore performing the non-performing nozzle detection operation during this loading and unloading operation is effective from the viewpoint of improving throughput, and from the viewpoint of preventing clogging of the discharge nozzles.

Furthermore, preferably the detector has a light emitter for emitting a detection light, and a receiver for receiving the detection light emitted from the light emitter, and the receiver determines whether the droplet is being discharged from the discharge nozzle, based on changes in the intensity of the detection light received by the receiver due to the droplet passing through the optical path of the detection light.

Accordingly, the non-performing nozzle detection operation can be carried out optically with good accuracy.

Furthermore, the controller preferably performs calibration of the receiver at a predetermined timing.

When performing a detection operation of non-performing nozzles a plurality of times, there are cases where the receiving sensitivity of the receiver, or the output signal value become different for each of the non-performing nozzle detections due for example to the temperature (heat) of the receiver or to noise attributable to the surrounding equipment (noise generating sources). In this case, by performing calibration of the receiver at a predetermined timing, such as for example before each execution of the non-performing nozzle detection operation, the detection accuracy of the receiver can be improved.

Furthermore, there may be provided a recovery unit performing a recovery operation of the discharge nozzle. In this case, preferably the controller performs the recovery operation corresponding to detection results of the detector, and reexecutes detection a predetermined number of times.

If so, then for example by performing a recovery operation such as a cleaning operation of the non-performing nozzles, the non-performing nozzles can be recovered to a condition where discharge is possible.

Furthermore, there may be provided a display device for displaying detection results of the detector, and an error based on the detection results.

If so, then for example an operator can ascertain if the detection operation for the non-performing nozzles is being performed normally, or if a non-performing nozzle is present, based on the display results of the display, thereby enabling a suitable process to be executed based on the display results of the display.

Furthermore, preferably the detector and the stage are provided at different locations.

As a result, the carrying operation of the substrate to and from the stage unit (for the load and unload operations), and the detection operation for the non-performing nozzle can be performed smoothly in parallel, enabling an improvement in throughput.

Furthermore, the discharge head is preferably two or more.

Of the plurality of discharge heads, for example after a first liquid material is discharged from a first discharge head onto the substrate, it is baked or dried, and then after a second liquid material is discharged from a second discharge head onto the substrate, it is baked and dried. Hereunder, by performing the same process using the plurality of discharge heads, a plurality of material layers is stacked on the substrate to form a multilayer pattern with good efficiency.

The second aspect preferably has the steps of emitting detection light towards a receiver, and determining whether the droplet is being discharged from the discharge nozzle, based on changes in the intensity of the detection light received by the receiver due to the droplet passing through the optical path of the detection light.

By so doing, the operation of detecting a non-performing nozzle can be performed optically with good accuracy. Calibration of the receiver may be performed at a predetermined timing. For the timing for performing the calibration, preferably this is performed immediately before the detection operation. By so doing, when performing a detection operation of non-performing nozzles a plurality of times, there are cases where the receiving sensitivity of the receiver, or the output signal value become different for each of the non-performing nozzle detections due for example to the temperature (heat) of the receiver, or to noise attributable to the surrounding equipment (noise generating sources). However, by performing calibration of the receiver before each execution of the non-performing nozzle detection operation, the detection accuracy of the receiver can be improved.

A third aspect of the present invention is electronic equipment has a device manufactured by the abovementioned device manufacturing apparatus, or the abovementioned device manufacturing method.

According to the electronic equipment of this aspect, since this has a device manufactured with good efficiency, electronic equipment can be provided in which low cost is realized.

BRIEF DESCRIPTION OF THE DRAWINGS

FIG. 15A to FIG. 15D are diagrams for describing a process of a micro lens manufacturing method.

DETAILED DESCRIPTION OF THE INVENTION

Hereunder is a description of a device manufacturing apparatus of the present invention.

Figure 1:
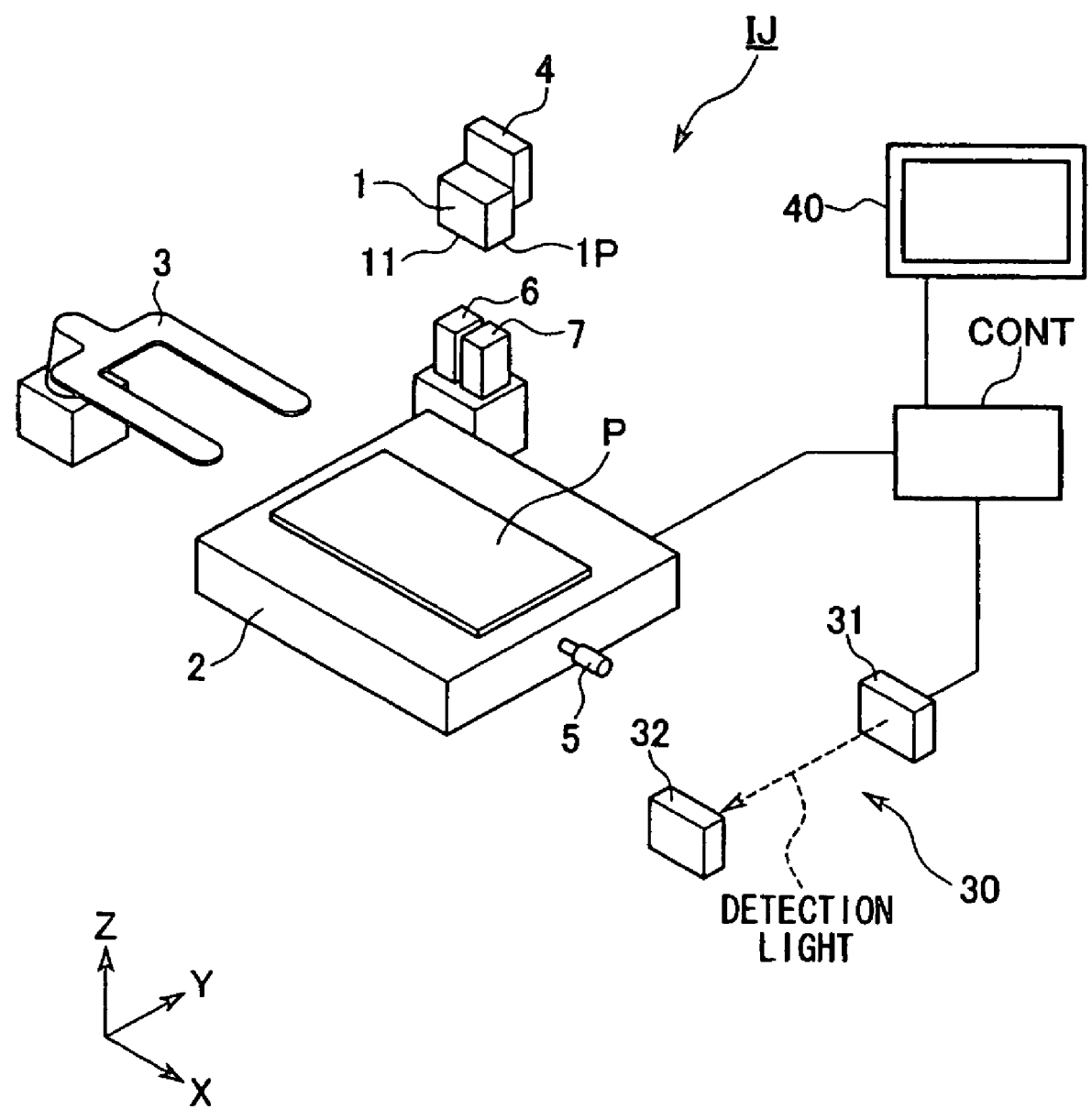
FIG. 1 is a schematic perspective view showing an embodiment of a device manufacturing apparatus of the present invention.

FIG. 1 is a schematic perspective view showing an embodiment of a device manufacturing apparatus of the present invention.

The device manufacturing apparatus of this embodiment comprises a droplet discharge apparatus incorporating a discharge head capable of discharging droplets of liquid material (liquid) containing functional material.

In FIG. 1, a device manufacturing apparatus IJ (droplet discharge apparatus) is provided with; a discharge head 1 for discharging droplets of liquid material, a stage 2 for supporting a substrate P, being a base material for manufacturing a device, a carrier 3 for carrying the substrate P to and from (loading and unloading) the stage 2, and a control unit CONT for control of the overall operation of the device manufacturing apparatus IJ including the discharge operation of the discharge head 1. In the present embodiment, the carrier 3 has a robot arm, and is arranged in the −X direction in the figure, of the stage 2. The discharge head 1 has a plurality of discharge nozzles 11 (refer to FIG. 2) on its discharge surface 1P, which discharge droplets of liquid material. The liquid material is stored in a storage unit (tank), which is not shown in the figure, and is discharged from the discharge head 1 via tubes. The device manufacturing apparatus IJ places liquid material onto the surface of the substrate P from the discharge head 1 to deposit functional material contained in the liquid material. The discharge head 1 is capable of being moved in the XY directions (horizontal directions) in the figure by a driving device 4, and is also capable of moving in the Z direction (vertical direction). Furthermore, the discharge head 1 is capable of moving in the θX direction (rotating around the X axis), θY direction (rotating around the Y axis), and θZ direction (rotating around the Z axis). The stage 2 is capable of being moved in the X and Y directions by a driving device 5, and is also capable of moving in the Z direction and the θZ direction. The stage 2 supporting the substrate P is capable of being moved relative to the discharge head 1 by the driving device 4 and the driving device 5.

A cleaning unit (recovery unit) 6 for cleaning the discharge head 1 and a capping unit 7 for capping the discharge head 1 are provided at a separate location from the stage 2, that is, a separate location from the location where droplets are discharged by the discharge head 1 for manufacturing devices. In the present embodiment, the cleaning unit 6 and the capping unit 7 are provided in the +Y direction of the stage 2. The cleaning unit 6 cleans the discharge nozzles 11 of the discharge head 1. When cleaning, the discharge head 1 is first positioned relative to the cleaning unit 6, and the cleaning unit 6 and the discharge surface 1P of the discharge head 1 are connected. Next, the cleaning unit 6 draws air out from the space formed between the cleaning unit 6 and the discharge surface 1P of the discharge head 1. By the space being evacuated, liquid material present in the discharge nozzles 11 of the discharge head 1 is sucked out, thus the discharge head 1 and the discharge nozzles 11 are cleaned. By performing the cleaning operation (recovery operation) on the discharge nozzles 11 with the cleaning unit 6, then for example a non-performing nozzle can be recovered. Furthermore, the capping unit 7 prevents the discharge surface 1P of the discharge head 1 from drying out, and caps the discharge surface 1P during stand-by time in which no device is manufactured.

Figure 2:
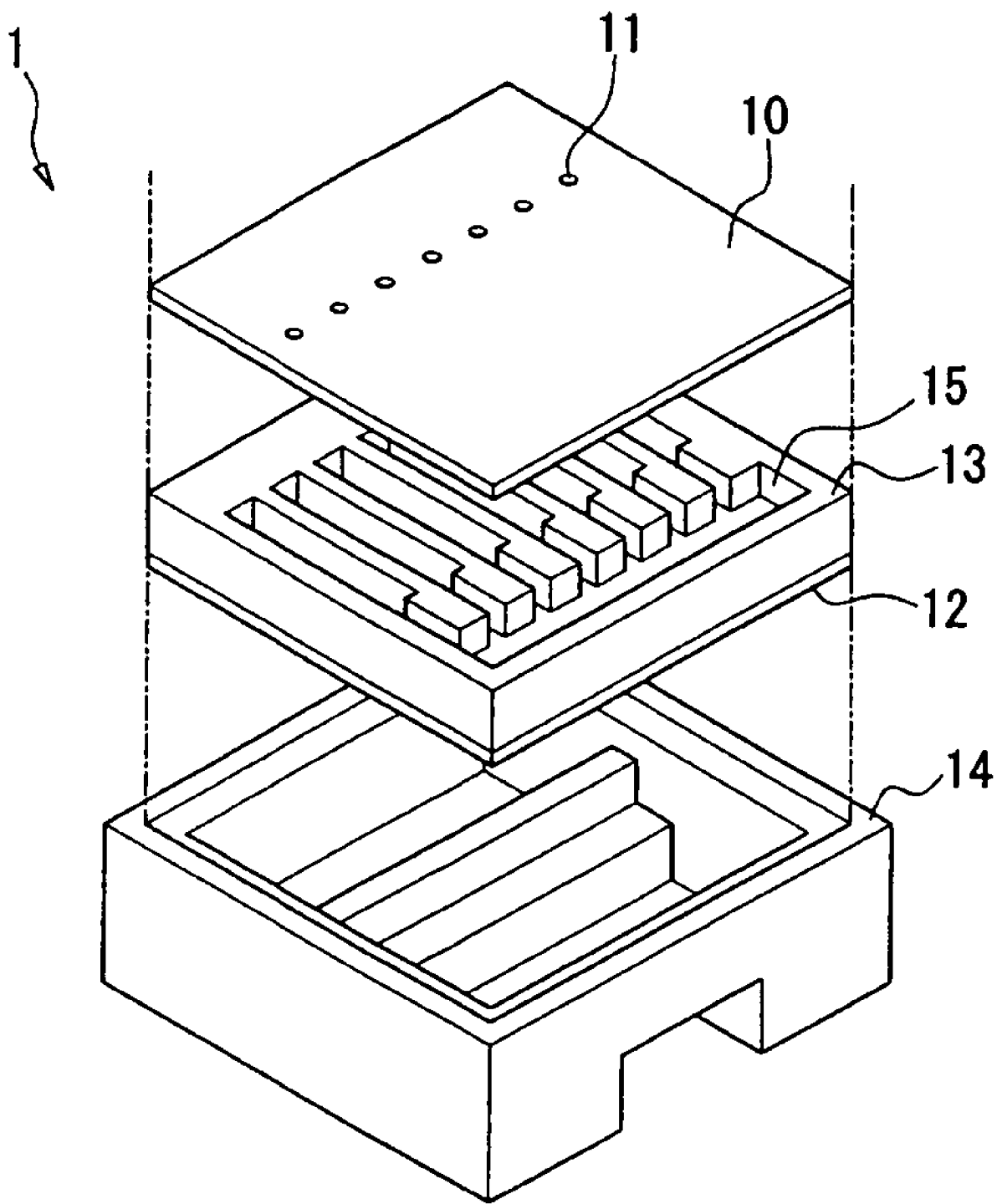
FIG. 2 shows a discharge head.
Figure 3:
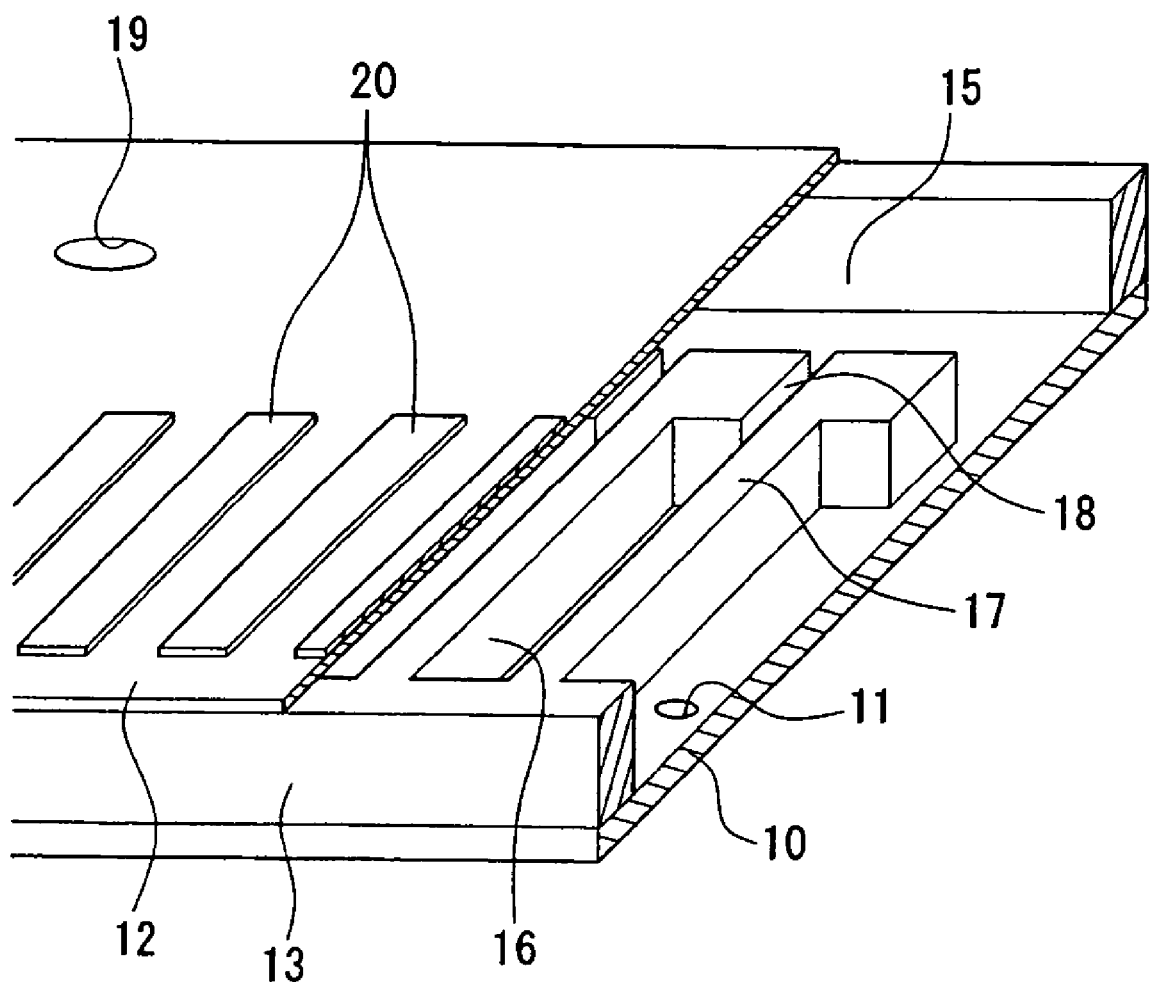
FIG. 3 shows the discharge head.

FIG. 2 is an exploded perspective view of the discharge head 1, and FIG. 3 is a partially sectioned perspective view of the discharge head 1. As shown in FIG. 2, the discharge head 1 has a nozzle plate 10 with discharge nozzles 11, a pressure chamber substrate 13 with a diaphragm 12, and a case 14, in which the nozzle plate 10 and the diaphragm 12 are fitted and supported. As shown in FIG. 3, the main part of the discharge head 1 has a structure whereby the pressure chamber substrate 13 is sandwiched between the nozzle plate 10 and the diaphragm 12. The pressure chamber substrate 13 is formed from a silicon monocrystal substrate or the like, and has a plurality of cavities (pressure chambers) 16 formed by etching. The discharge nozzles 11 are formed at locations in the nozzle plate 10 corresponding to the cavities 16 when the nozzle plate 10 and the pressure chamber substrate 13 are bonded together.

Side walls 17 separate the plurality of cavities 16. Each of the cavities 16 is linked to a reservoir 15, being a common flow path, via a supply port 18. The diaphragm 12 is formed for example from a thermally oxidized film or the like. The diaphragm 12 has a tank aperture 19, and liquid material is supplied from the tank aperture 19 via a tube connected to the tank. Piezoelectric elements 20 are provided at locations corresponding to the cavities 16 in the diaphragm 12. Each of the piezoelectric elements 20 has a structure in which piezoelectric ceramic crystals such as PZT elements or the like are sandwiched between a top electrode and a bottom electrode (not shown in the figure). The piezoelectric elements 20 are deformed in accordance with an applied voltage.

Referring back to FIG. 1, the device manufacturing apparatus IJ is provided with a detection apparatus 30 that detects a discharge condition of droplets of liquid material discharged from the discharge nozzles 11 of the discharge head 1, specifically whether droplets of liquid material are being discharged. The detection apparatus 30 is provided at a separate location from the stage 2, that is, at a separate location from the location where the droplet discharge operation is performed by the discharge head 1 for manufacturing devices. In the present embodiment, it is provided in the +X direction from the stage 2. The detection apparatus 30 detects a discharge nozzle (non-performing nozzle) that cannot discharge droplets due to clogging or the like, by detecting whether a droplet of liquid material is discharged from each of the plurality of discharge nozzles 11 installed in the discharge head 1. As a result, it is possible to detect whether a dot is missing from the substrate P when forming a dot pattern on the substrate by discharging droplets onto the substrate P.

The detection apparatus 30 is provided with a light emitter 31 for emitting detection light, and a receiver 32 capable of receiving detection light emitted from the light emitter 31. The light emitter 31 comprises a laser beam emitting device that emits a laser beam of a predetermined diameter. On the other hand, the receiver 32 comprises for example a photodiode. Furthermore, the device manufacturing apparatus IJ is provided with a display unit 40 that displays information related to detection results and detection conditions (detection operations) of the detection apparatus 30. The display unit 40 comprises for example a liquid crystal display, a CRT, or the like.

Figure 4:
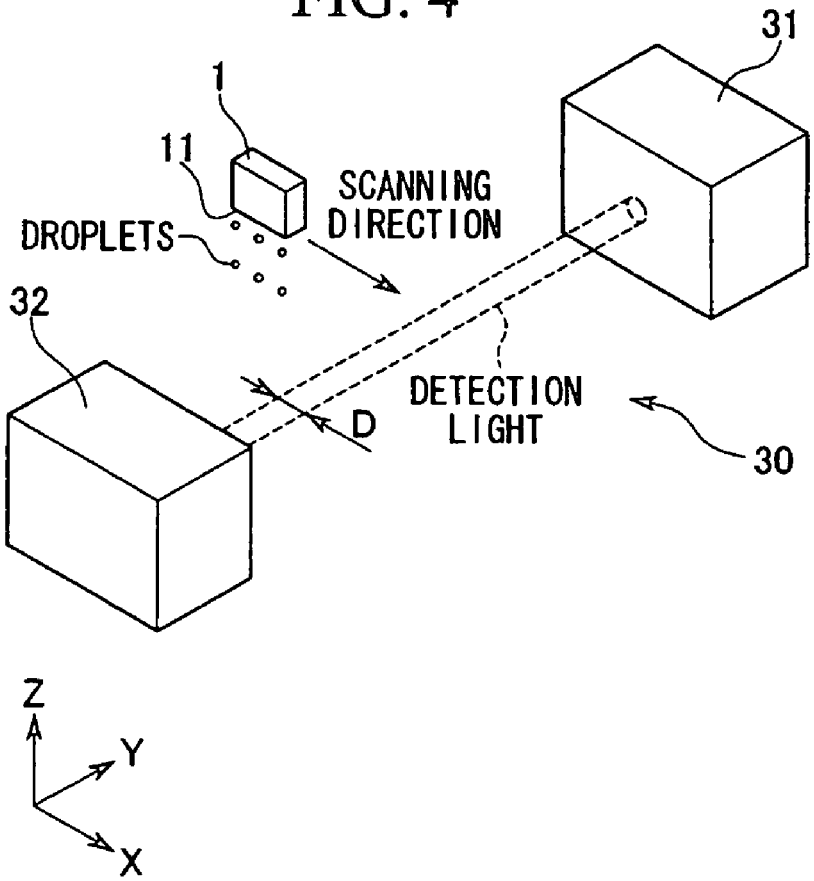
FIG. 4 is a schematic perspective view showing an embodiment of the detection apparatus.

FIG. 4 is a schematic perspective view of the detection apparatus 30 with the light emitter 31 and the receiver 32. As shown in FIG. 4, the light emitter 31 and the receiver 32 are arranged opposite each other. In the present embodiment, the light emitter 31 emits a laser beam, being a detection light, along the Y axis direction. The beam of the detection light is set to a diameter D, and the detection light emitted from the light emitter 31 travels straight toward the receiver 32. The discharge head 1 discharges droplets from above the light path of the detection light (on the +Z side), while being scanned in a direction (the X axis direction) that intersects the light path direction (the Y axis direction) of the detection light. The arrangement is such that droplets discharged from the discharge nozzles 11 of the discharge head 1 pass through the optical path of the detection light.

Figure 5:
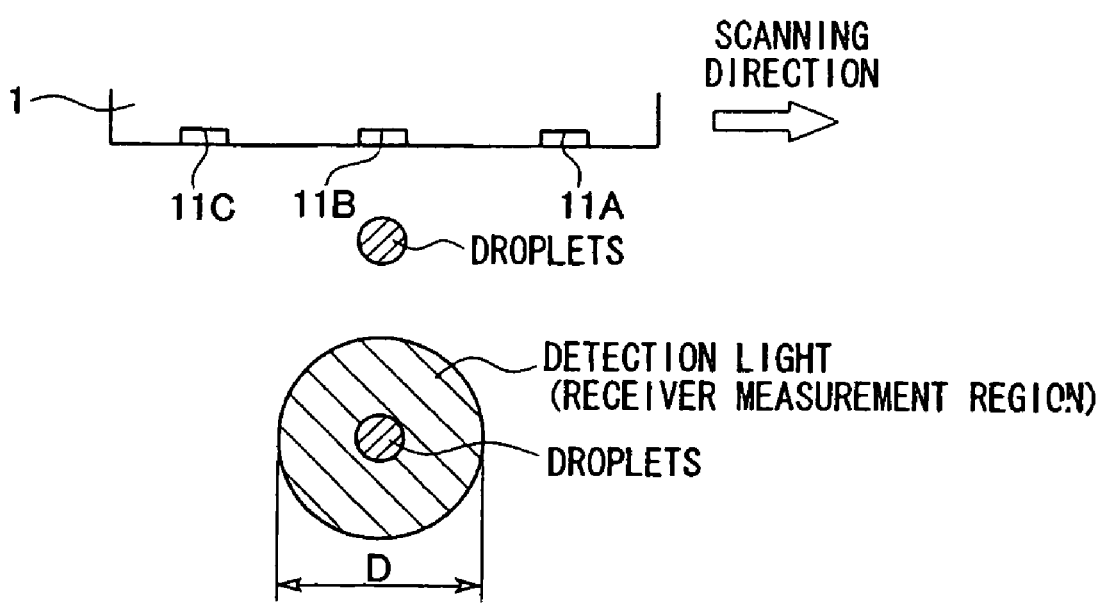
FIG. 5 is a schematic diagram showing how droplets discharged from a discharge head pass through the optical path of a detection light of the detection apparatus.

FIG. 5 is a schematic diagram showing how droplets discharged from the discharge nozzles 11 of the discharge head 1 pass through the optical path of a detection light. The discharge head 1 shown in FIG. 5 has discharge nozzles 11A, 11B and 11C, which are aligned in the X axis direction, being the scanning direction. However, the number of discharge nozzles 11 arranged in the discharge head 1 can be optionally set.

As shown in FIG. 5, the discharge head 1 discharges droplets from each of the discharge nozzles 11A to 11C while scanning in the X axis direction. The discharged droplets pass through the optical path of the detection light, being a light beam of diameter D. Here the diameter of the detection light, and the diameter of the measurement region of the detector 32, are set to the same value D. Droplets pass through the optical path of the detection light, and the droplets are arranged on the optical path of this detection light, thus the intensity of detection light received by the receiver 32 changes relative to the intensity of light received in a situation where there is no droplet placed on the light path of the detection light. That is, by placing droplets on the light path of the detection light, the reception signal of the receiver 32 is lower compared with the case where no droplet is placed on the light path of the detection light. The received light result (received light signal) of the receiver 32 is output to the control unit CONT. The control unit CONT can determine whether there is a droplet discharged from a discharge nozzle 11 or not, based on the change (fall) in the intensity of the detection light received in the receiver 32, caused by a droplet passing through the optical path of the detection light.

To be specific, when a droplet is placed on the optical path of the detection light, the output signal (output voltage) of the receiver 32 changes when the intensity of light received in the receiver 32 falls. The receiver 32 outputs a "HIGH" or "LOW" signal based on this output voltage to the control unit CONT. Here, the receiver 32 may output a "HIGH" signal in the case where droplets are situated on the optical path of the detection light, and output a "LOW" signal where droplets are not situated on the optical path of the detection light.

FIG. 1 shows only one discharge head 1 and the stage 2. However, the droplet discharge apparatus IJ may comprise a plurality of discharge heads 1 and stages 2. In this case, droplets of different types or the same type of liquid material may be discharged from the plurality of discharge heads 1. After a first liquid material is discharged from a first discharge head of the plurality of discharge heads 1 onto the substrate P, it is baked or dried, and then after a second liquid material is discharged from a second discharge head onto the substrate P, it is baked or dried. Hereunder, by performing the same process using the plurality of discharge heads, a plurality of material layers is stacked on the substrate P to form a multilayer pattern.

Figure 6:
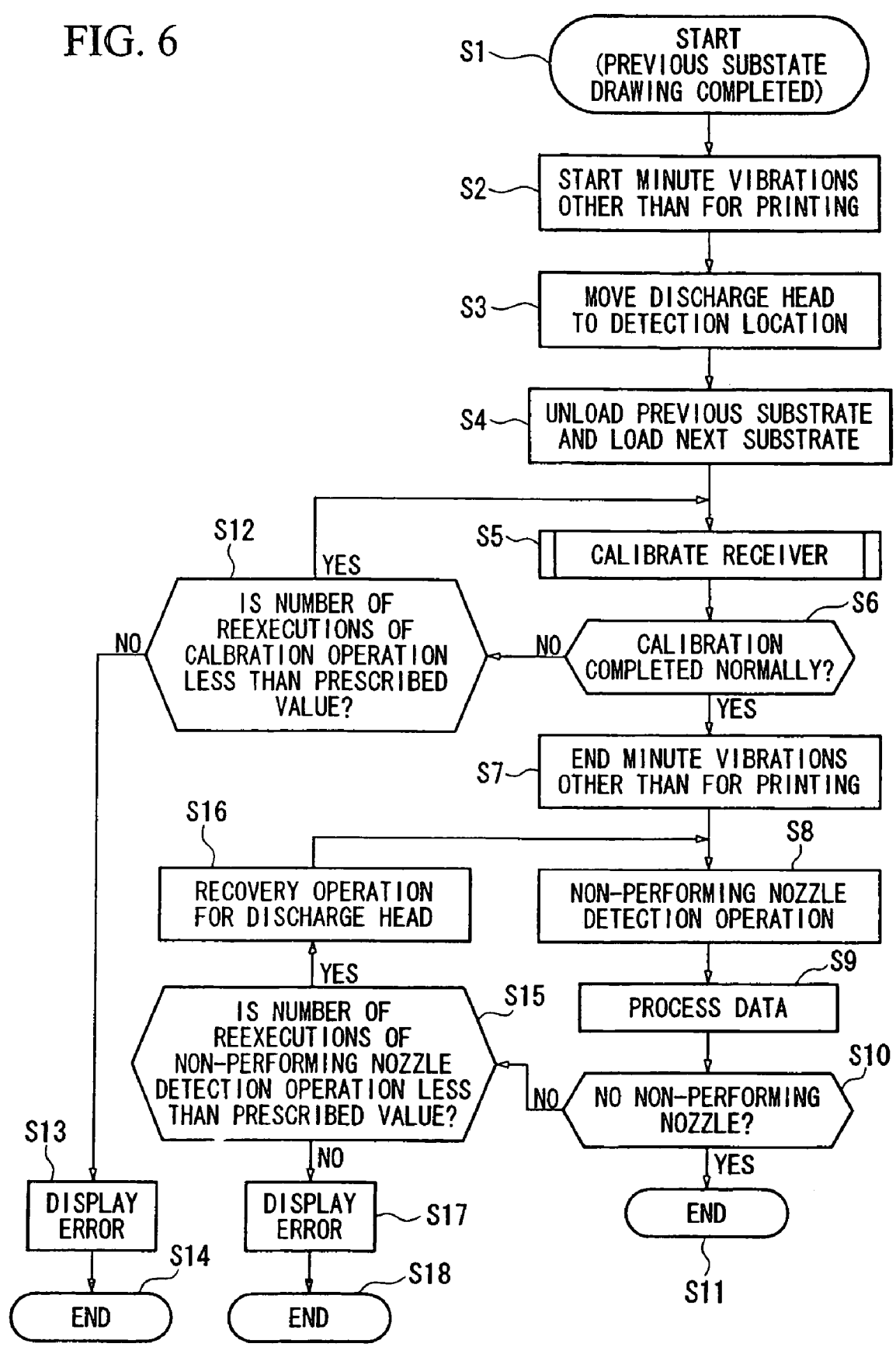
FIG. 6 is a flow chart of a main routine showing an example of a device manufacturing method of the present invention.
Figure 7:
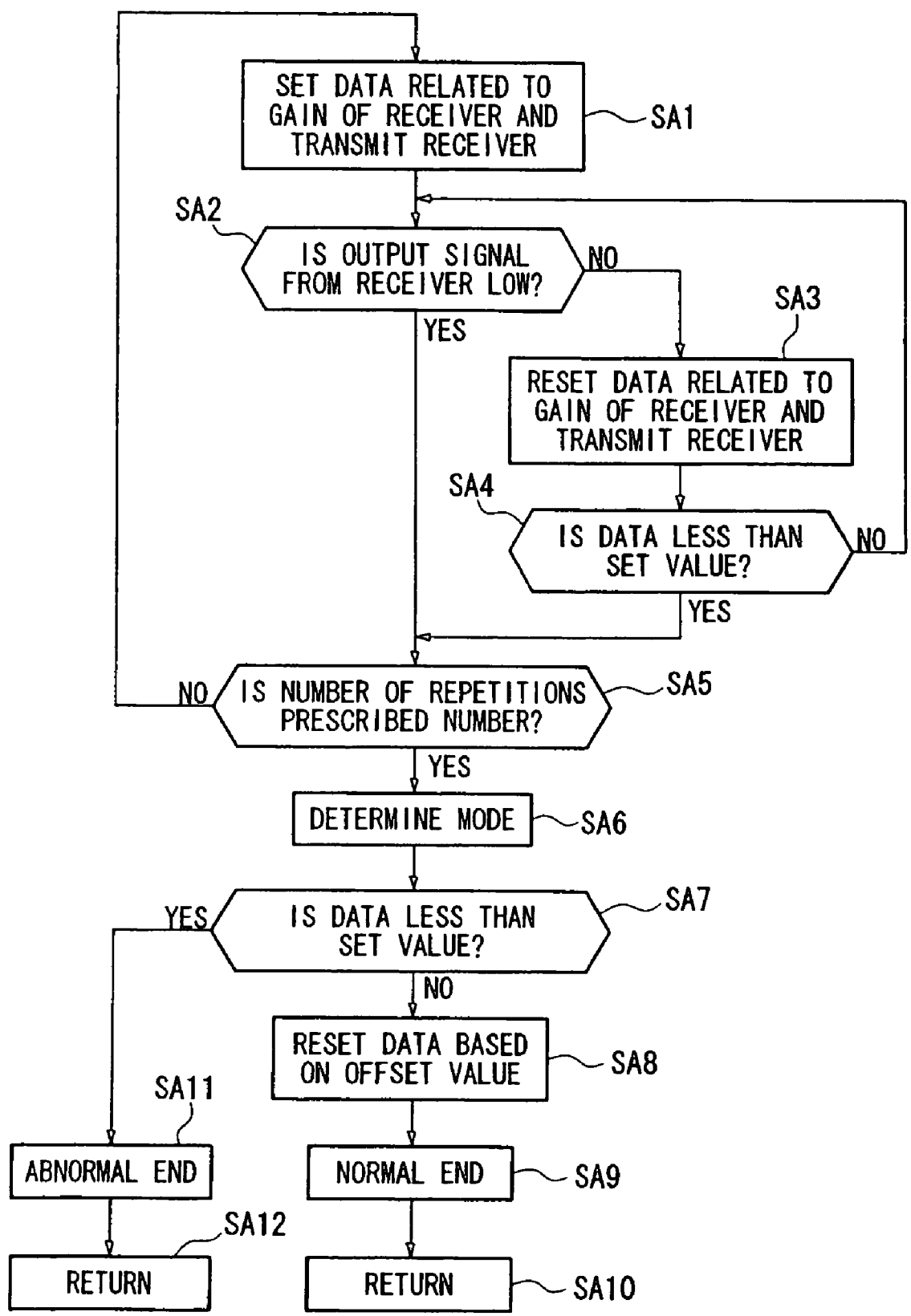
FIG. 7 is a flow chart showing an example of a calibration operation for a receiver, being a subroutine.

Next is a description with reference to the flow charts of FIG. 6 and FIG. 7, of a method of manufacturing a device using the device manufacturing apparatus IJ having the above described construction.

FIG. 6 shows a procedure (main routine) for a device manufacturing apparatus IJ, and FIG. 7 shows a procedure (subroutine) for calibration of the receiver 32, being step S5 in FIG. 6.

In FIG. 6, the droplets of the liquid material from the discharge head 1 have been discharged onto the substrate P supported by the stage 2 in order to manufacture a device, and on completion of this liquid discharge operation (pattern drawing operation), the control unit CONT starts the non-performing nozzle detection operation for the discharge head 1 (step S1).

The control unit CONT, on completion of the liquid discharge operation for manufacturing the device by means of the discharge head 1, vibrates the meniscus of the liquid material in order to prevent clogging of the discharge nozzle 11 attributable to drying (coagulation) of the liquid material in the interior of the discharge head 1. That is, the control unit CONT starts an operation of minute vibrations (minute vibrations other than for printing) of the piezoelectric element 20 to an extend such that droplets are not discharged from the discharge head 1 (step S2). Then, the control unit CONT moves the discharge head by means of the driving device 4, to the location where the operation of detecting non-performing nozzles is carried out, that is, in the vicinity of the detection apparatus 30 (step S3). Next, the control unit CONT starts to execute on the carrier 3, the operation for carrying out (unloading, removing) from the stage 2, only the substrate P for which the pattern drawing process has been completed, supported on the stage 2, and the operation for carrying in (loading, supplying) to the stage 2, the next new substrate P which is to be subjected to pattern drawing (step S4). The operations of step S3 and step S4 may be executed at the same time, or the operation of step S4 may be executed before the operation of step S3.

The control unit CONT executes a non-performing nozzle detection step (detection step) for detecting whether or not liquid (a droplet) is being discharged from the discharge nozzle 11 of the discharge head 1, while the operation of carrying the substrate P (carrying step) to or from the stage unit 2 is being performed by the carrier 3. The control unit CONT after instructing the start of the loading and unloading operation for the carrier 3 in step S4, starts non-performing nozzle detection operation by the detection apparatus 30. At first, when the non-performing nozzle detection operation is being carried out, the control unit CONT performs a calibration of the detector 32 (step S5).

Here is a description of the procedure (subroutine) of step S5, with reference to FIG. 7. In this embodiment, the calibration operation for the detector 32 is an operation (auto-gain-control) which appropriately sets automatically the gain between the input signal for the receiver 32 and the output signal of the receiver 32 based on irradiation of detection light. More specifically, in the condition where the droplet is not positioned on the optical path of the detection light, the gain is set so that the output signal from the detector 32 becomes a "LOW". Moreover, during the calibration operation, detection light from the light emitter 31 continues to be output at a constant output, and the droplet is not discharged from the discharge head 1.

When performing the calibration of the receiver 32, the control unit CONT sets the data related to the gain between the input signal and the output signal of the receiver 32, and transmits this data to the receiver 32 (step SA1). More specifically, the control unit CONT sets a plurality of gain data (gain values) within a predetermined range set beforehand, and transmits this to the receiver 32 in a sequence from gain data having a large value of this set plurality of gain data to gain data having a small value. Here, at first, the gain data of the maximum value of the set plurality of gain data is transmitted. For example, if the gain data is set in a range of "4000 to 2000", the control unit CONT first transmits the value of "4000" to the receiver 32.

Then the control unit CONT determines whether or not the output signal of the detector 32 is being output normally based on the transmitted gain data "4000". That is, if the gain data is not the maximum value, then even if the droplet is not positioned on the light path of the detection light, the output signal from the detector 32 may be a "HIGH". Consequently, the control unit CONT determines whether the output signal from the detector 32 is a "LOW" or not, based on the transmitted gain data "4000" (step SA2).

In step SA2, if determined that the output signal from the receiver 32 is not a "LOW", the control unit CONT resets the gain data, and transmits this reset gain data to the receiver 32 (step SA3). That is to say, the gain data set in step SA1, since this is larger than the gain value which a normal output signal should output from the receiver 32, the control unit CONT resets the gain data to a smaller value, for example "2600" than the value set in step SA1, and transmits this gain data "2600" to the receiver 32. The control unit CONT determines whether or not the reset gain data "2600" is less than a previously set set value (for example "2000") (step SA4). That is, in the case where a "LOW" is not output from the receiver 32, even thought the gain value is less than the set value "2000" being the minimum value of the predetermined range "4000 to 2000", it is considered that a condition has arisen where the receiver 32, due to some cause (an apparatus fault or the like), cannot output a normal output signal. Therefore, in the case where it is determined that the gain data is less than the predetermined value, the control unit CONT comes out from the loop. On the other hand, in the case where it is determined that the gain data is more than the predetermined value, the control unit CONT returns to step SA2, and determines whether or not the output signal from the receiver 32 is a "LOW", based on the transmitted gain data "2600".

In step SA2, if determined that the output signal from the receiver 32 is a "LOW", the control unit CONT repeats this process a prescribed number of times (for example five times) while performing setting change of the gain data. More specifically, the control unit CONT acquires gain data "2600, 2600, 2600, 2500, 2500" which gives a "LOW". The control unit CONT determines if the number of repetitions has reached the prescribed number of times (step SA5).

The control unit CONT determines the mode which obtains the "LOW" from the gain data for the abovementioned five times (step SA6). Here, of the gain data "2600, 2600, 2600, 2500, 2500" for the five times, "2600" is the gain value obtained most frequently (the mode). By so doing, the reliability of the gain data for obtaining the output signal of "LOW" is improved. That is to say, for example in the case where the gain value which obtains a "LOW" changes, attributable to noise of various equipment (noise generating source) present in the surroundings of the receiver 32, or to the temperature (heat) of the receiver 32 itself. Consequently, by repeating the prescribed number of processes, and determining the mode, the data reliability is improved.

Next, the control unit CONT determines whether or not the determined mode "2600" is less than a previously set set value (for example, "2000") (step SA7). In step SA7, if determined that the mode is greater than the set value, the control unit CONT resets the gain data based on a previously set offset value (step SA8). More specifically, the offset value (for example "500") is subtracted from the mode "2600", and the gain data is reset to "2100". This is the case where for example a "HIGH" is output even if the gain value is for example "2600", attributable for example to noise of various equipment (noise generating source) present in the surroundings of the receiver 32, or to the temperature (heat) of the receiver 32 itself. Consequently, so the output signal of "LOW" is reliably obtained from the receiver 32 in the case where droplets are not present on the optical path of the detection light, the gain value is corrected downwards. Once the gain value is set, the calibration operation of the receiver 32 is normally ended. (step SA9), and the flow returns to the main routine (step SA10).

On the other hand, in step SA7, if determined that the mode is less than the set value, the control unit CONT abnormally ends the calibration operation of the receiver 32 (step SA11) and the flow returns to the main routine (step SA12). That is to say, in the case where the gain value is less than the set value "2000", being the minimum value of the predetermined range "4000 to 2000", this is unsuitable as the gain value, and there is the likelihood that a situation may occur where the subsequent non-performing nozzle detection operation cannot be performed smoothly. Consequently, the control unit CONT, in the case where the determined mode is less than the previously set set value, abnormally terminates the calibration operation of the receiver 32.

Here, the operational result of the calibration operation of the receiver 32, that is, the result of whether or not the calibration operation has been normally terminated, is displayed on the display unit 40 (refer to FIG. 1).

Returning to FIG. 6, if the calibration for setting the gain of the receiver 32 has been completed, the control unit CONT determines if the calibration operation has been normally completed (step S6). If determined that the calibration operation has been normally completed, the control unit CONT terminates the microvibrations (the minute vibrations other than for printing) of the piezoelectric element 20 of the discharge head 1, that is to say, the minute vibrations of the meniscus of the liquid material in the interior of the discharge head 1 (step S7). Then, the control unit CONT, as described using FIG. 4 and FIG. 5, emits detection light toward the receiver 32 from the light emitter 31, and while scanning the discharge head 1 in a direction to intersect the optical path direction of the detection light radiated from the light emitter 31, discharges the droplet, to perform the non-performing nozzle detection operation (step S8). An output signal from the receiver 32 is output to the control unit CONT, and the control unit CONT performs signal processing (data processing) on the output signal from the receiver 32 (step S9). The control unit CONT determines whether droplets are being discharged from the discharge nozzles 11 of the discharge head 1, based on changes (a drop) in the intensity of detection light received by the receiver 32 due to droplets discharged from the discharge head 1 passing through the optical path of the detection light (step S10). If determined the there is no non-performing nozzle in the plurality of discharge nozzles 11, the control unit CONT terminates this series of processing related to the non-performing nozzle detection (step S11).

On the other hand, in step S6, if determined that the calibration operation has been abnormally terminated, the control unit CONT determines whether or not the number of reexecutions of the calibration operation is less than a specified value (step S12). If determined that the number of reexecutions of the calibration operation is less than the specified value (for example, three times), the control unit CONT returns the flow to step S5, and reexecutes the calibration operation of the receiver 32. On the other hand, in step S12, if determined that the number of reexecutions of the calibration operation has reached the prescribed value (three times), the control unit CONT makes a display on the display 40 to the effect that the calibration operation has been abnormally terminated (step S13) and terminates the processing (step S14).

Furthermore, in step S10, if determined that there is a non-performing nozzle, the control unit CONT determines whether or not the number of reexecutions of the non-performing nozzle detection operation is less than a prescribed value (step S15). If determined that the number of reexecutions of the non-performing nozzle detection operation is less than the prescribed value (for example, two times), the control unit CONT performs a recovery operation of the discharge head 1 (step S16). More specifically, a cleaning operation is performed on the discharge head 1 by means of the cleaning unit 6. Then, once the recovery operation has been performed, the flow returns to step S8, and the non-performing nozzle detection operation is reexecuted. On the other hand, in step S15, if determined that the number of the reexecutions of the non-performing nozzle detection operation has reached the prescribed value (two times), the control unit CONT displays on the display 40 to the effect that the discharge nozzle 11 of the discharge head 1 is not performing normally (that is, there is a non-performing nozzle) (step S17), and the process is terminated (step S18).

Moreover, during the series of processing related to the non-performing nozzle detection (steps S1 through S18), the carrier 3 carries a new substrate P to the stage 2. The control unit CONT moves the discharge head 1 which is confirmed in step S10 to be operating normally, to the stage 2 (the droplet discharge operation execution position for manufacturing the device), and discharges droplets of liquid material from the discharge head 1 onto the substrate P which is supported on the stage 2.

As described above, while performing the loading and unloading operation of the substrate P with respect to the stage 2, the non-performing nozzle detection operation is performed for detecting whether or not droplets are being discharged from the discharge nozzle 11. Therefore, the load and unload operation of the substrate P, and the non-performing nozzle detection operation can be carried out in parallel. Consequently, the non-performing nozzle detection can be performed in a condition where a high throughput is maintained, without disturbing execution of the droplet discharge operation for manufacturing the device. Moreover, since the device can be manufactured using a discharge head 1 which has been confirmed to be operating normally with no non-performing nozzles, a device having a desired performance can be manufactured.

Furthermore, in this embodiment, the construction is such that the substrates P are loaded and unloaded one by one with respect to the stage 2. Consequently, by performing a non-performing nozzle detection operation for each of these load and unload operations, a drop in throughput can be effectively suppressed. Furthermore, when performing discharge of droplets onto the substrate P, it is always possible to execute a droplet discharge operation for the substrate P, using a discharge head 1 for which normal operation has been confirmed.

Here, in this embodiment, for the timing for executing the non-performing nozzle detection operation, the construction is such that this is executed when a substrate P for which the drawing process has been completed, is unloaded from the stage 2 and a new substrate P is loaded onto the stage 2. However, this may also include the startup time for the device manufacturing apparatus IJ.

FIG. 8 shows an example of a process for manufacturing devices by a device manufacturing apparatus IJ of the present invention, showing an example of a process for manufacturing color filters of liquid crystal devices.

Figure 8A:
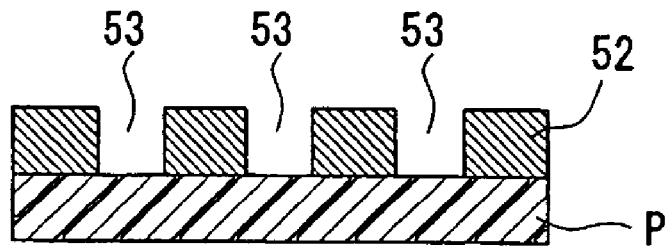
FIG. 8A to FIG. 8F show a manufacturing process for a color filter as an example of a device.

Firstly, as shown in FIG. 8A, black matrices 52 are formed on one surface of the transparent substrate P. For a method of forming the black matrices 52, resin (preferably black) with no optical transparency is coated at a prescribed thickness (for example, approximately 2 μm) by a method such as spin coating or the like. For minimum display elements surrounded by the grid of black matrices 52, that is, filter elements 53, for example, the width in the X axis direction is approximately 30 μm, and the length in the Y axis direction is approximately 100 μm.

Figure 8B:
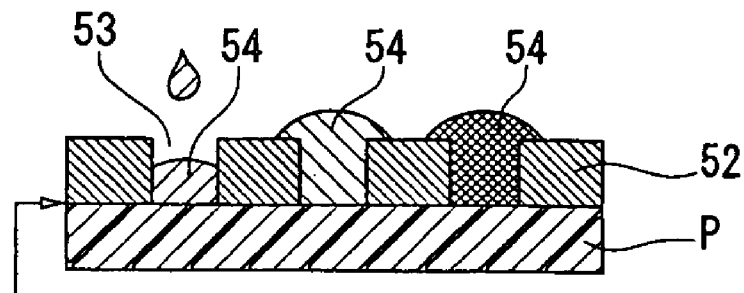

Next, as shown in FIG. 8B, a liquid material (droplet) 54 for a color filter is discharged from the discharge apparatus, and this lands on the filter element 53. The amount of liquid material 54 discharged should be a sufficient amount considering the reduction in the volume of liquid material during heating treatment.

Figure 8C:
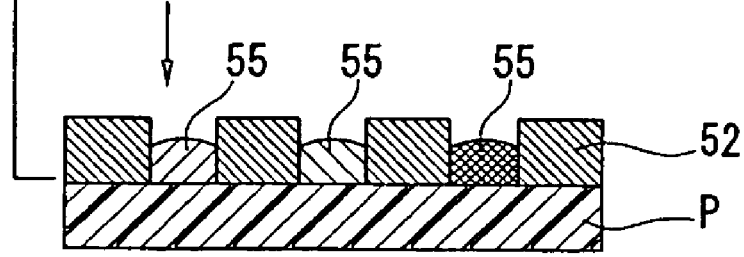

When the droplets 54 fill all filter elements 53 on the substrates P in this manner, heating treatment is performed using a heater such that the substrate P reaches a prescribed temperature (for example, approximately 70° C.). By this heating treatment, solvent evaporates from the liquid material, so that the volume of the liquid material is reduced. In the case where this volume reduction is extreme, the droplet discharge process and heating treatment are repeated until a sufficient color filter film thickness is obtained. By this process, solvent contained in the liquid material evaporates, and only solids (functional material) contained in the liquid material remain to form the final film, forming color filters 55 as shown in FIG. 8C.

Figure 8D:
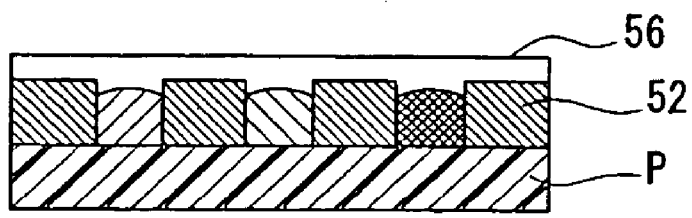

Next as shown in FIG. 8D, in order to make the substrate P smooth, and to protect the color filters 55, the color filters 55 and the black matrices 52 are covered by forming a protective film 56 on the substrate P. When forming this protective film 56, a method such as spin coating, roll coating, dipping or the like can be used. However, similarly to the case of the color filters 55, it may also be formed using the discharge apparatus.

Figure 8E:
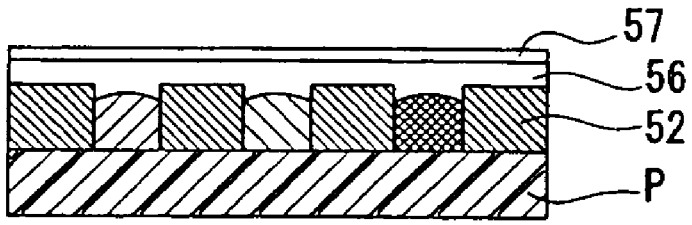
Figure 8F:
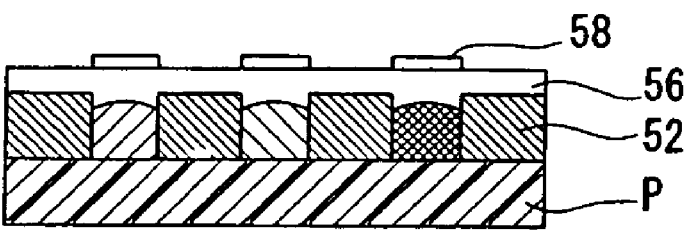

Next as shown in FIG. 8E, a transparent conductive film 57 is formed over the whole surface of this protective film 56 using a sputtering technique, a vacuum evaporation method or the like. Afterwards, the transparent conductive film 57 is patterned, and pixel electrodes 58 are patterned corresponding to the filter elements 53. In a case where TFTs (Thin Film Transistors) are used to drive a liquid crystal display panel, this patterning is not required.

In such color filter manufacturing, since the discharge head 1 is used, it is possible to discharge color filter material continuously without problems. Thus it is possible to form good color filters as well as improving the productivity.

Furthermore, in the discharge apparatus, it is possible to form optional system components of electro-optical devices by selecting appropriate liquid material. For example, by using for the liquid, a range of materials such as; material for forming organic EL elements, metal colloids which become material for metal wiring, or microlens material, liquid crystal material and the like, it is possible to form various system components constituting electro-optical devices. Alternatively, it is also possible to form a SED (Surface-Conduction Electron-Emitter Display) as an electro-optical device.

Hereunder is a description of a manufacturing method for an electro-optical device using the above-described droplet discharge apparatus IJ.

Firstly, a manufacturing method for an organic EL device will be described as an example of forming a system component of an electro-optical device.

Figure 9:
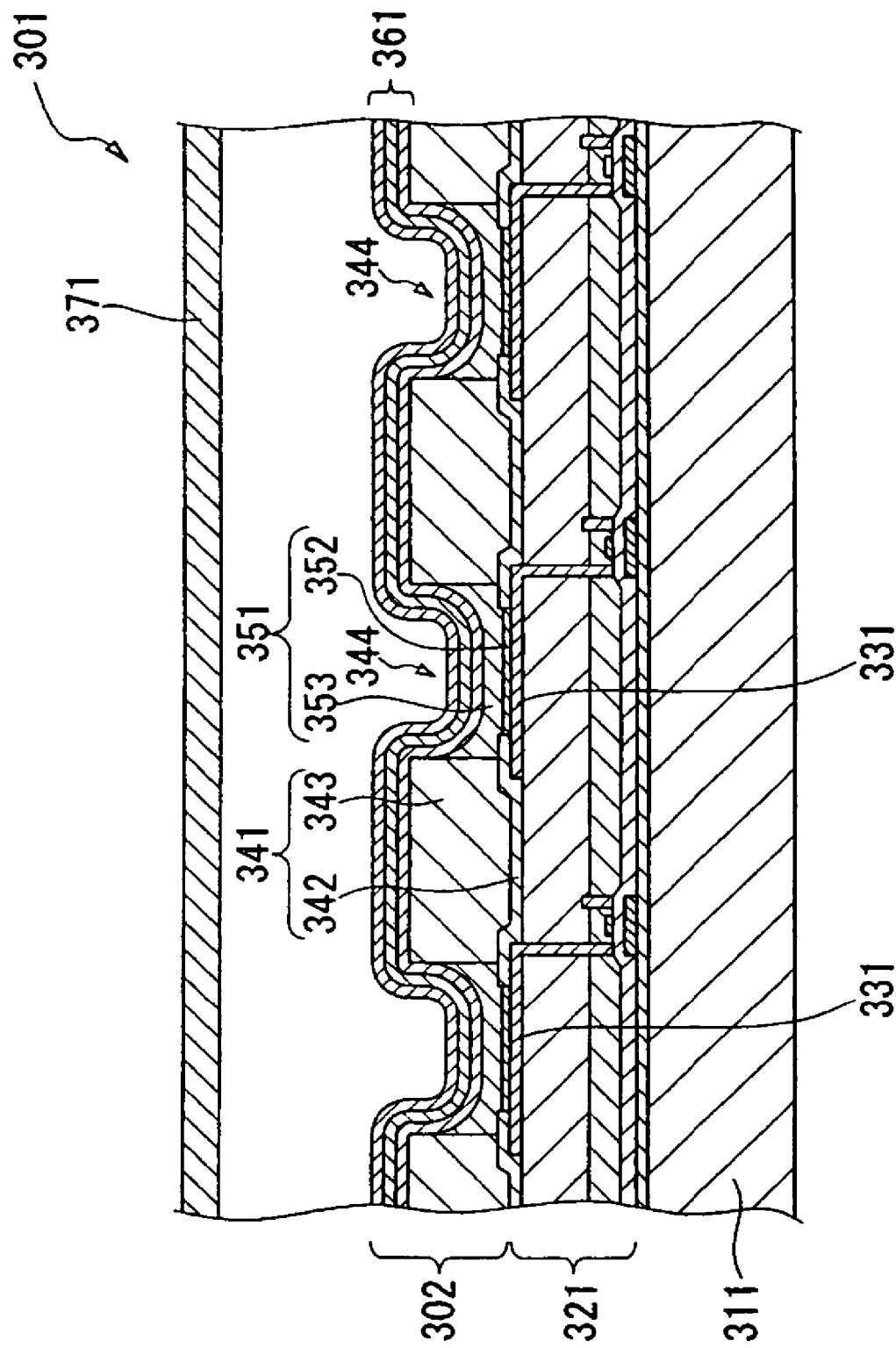
FIG. 9 is a sectional side elevation of an organic EL device.

FIG. 9 is a sectional side elevation of an organic EL device which constitutes part of a system component manufactured using the discharge apparatus. Firstly, a structural outline of this organic EL device will be described. The organic EL device formed here is an embodiment of an electro-optical device of the present invention.

An organic EL device 301, as shown in FIG. 9, is one where an organic EL element 302 comprising; a substrate 311, a circuit element section 321, pixel electrodes 331, bank sections 341, light emitting diodes 351, a cathode 361 (counter electrode), and a sealing substrate 371, is connected by the wiring of a flexible substrate (omitted from the figure) to a drive IC (omitted from the figure). The circuit element section 321 is formed on the substrate 311, and a plurality of pixel electrodes 331 is arranged in a line on the circuit element section 321. The bank sections 341 are formed in a grid shape between the pixel electrodes 331, and light emitting diodes 351 are formed in concave apertures 344 formed by the bank sections 341. The cathode 361 is formed over the whole surface of the bank sections 341 and the light emitting diodes 351, and the sealing substrate 371 is laminated onto the cathode 361.

The manufacturing process for an organic EL device 301 containing the organic EL element has a bank section forming process for forming the bank sections 341, a plasma processing process for forming the light emitting diodes 351 appropriately, a light emitting diode forming process for forming the light emitting diodes 351, a counter electrode forming process for forming the cathode 361, and a sealing process for laminating the sealing substrate 371 onto the cathode 361 for sealing.

The light emitting diode forming process forms the light emitting diodes 351 by forming a hole injection layer 352 and a luminous layer 353 in the concave apertures 344, namely on the pixel electrodes 331, and comprises a hole injection layer forming process and a luminous layer forming process. The hole injection layer forming process has a first discharge process for discharging a first component (liquid) to form the hole injection layer 352 on the pixel electrodes 331, and a first drying process for drying the discharged first component to form the hole injection layer 352. The luminous layer forming process has a second discharge process for discharging a second component (liquid) to form the luminous layer 353 on the hole injection layer 352, and a second drying process for drying the discharged second component to form the luminous layer 353.

In this light emitting diode forming process, the droplet discharge apparatus IJ is used in the first discharge process in the hole injection layer forming process, and the second discharge process in the luminous layer forming process.

In this organic EL device 301 also, by verifying the discharge operation of the discharge head 1 in advance prior to discharge for forming each system component, it is possible to discharge forming material of the hole injection layer and forming material of the luminous layer from the discharge head 1 satisfactorily. Therefore, it is possible to improve the reliability of the organic EL device 301 obtained.

Next is a description of a manufacturing method for a plasma display as an example of forming a system component.

Figure 10:
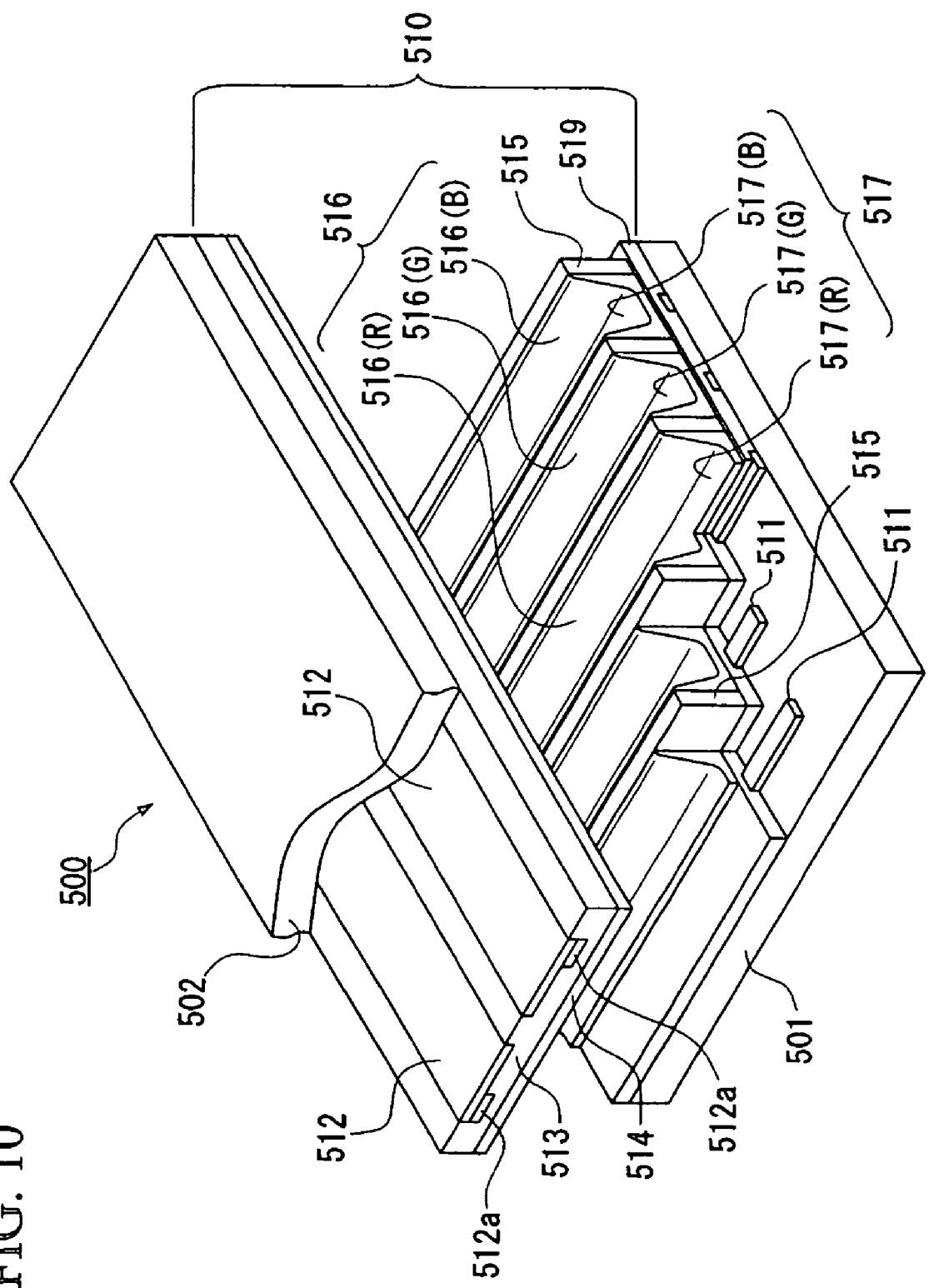
FIG. 10 is an exploded perspective view of a plasma display.

FIG. 10 is an exploded perspective view showing a plasma display, being a system component, parts of which, namely address electrodes 511 and bus electrodes 512a, are manufactured by the droplet discharge apparatus IJ. In FIG. 10, reference numeral 500 denotes a plasma display. This plasma display 500 basically comprises a glass substrate 501, a glass substrate 502, and an electrical discharge display section 510 formed therebetween.

The electrical discharge display section 510 is assembled with a plurality of electrical discharge chambers, which are arranged such that a set of three electrical discharge chambers 516 forms one pixel, being a red electrical discharge chamber 516 (R), a green electrical discharge chamber 516 (G), and a blue electrical discharge chamber 516 (B).

The address electrodes 511 are formed in strips at a predetermined spacing on the surface of the (glass) substrate 501, and a dielectric layer 519 is formed so as to cover the surfaces of the address electrodes 511 and the substrate 501. Furthermore, partitions 515 are formed on the dielectric layer 519 between the address electrodes 511, parallel with the address electrodes 511. The partitions 515 are also divided (omitted from the figure) at predetermined locations in their longitudinal direction, perpendicular to the address electrodes 511. Basically, rectangular regions are formed, divided by adjacent partitions on the left and right sides in the widthwise direction of the address electrodes 511, and partitions arranged perpendicular to the address electrodes 511, forming electrical discharge chambers 516 corresponding to the rectangular regions, and a set of three rectangular regions constitutes one pixel. Furthermore, fluorescent substances 517 fill the rectangular regions divided by the partitions 515. The fluorescent substances 517 fluoresce with any one of red, green and blue emissions: a red fluorescent substance 517 (R) fills the bottom of the red electrical discharge chamber 516 (R), a green fluorescent substance 517 (G) the bottom of the green electrical discharge chamber 516 (G), and a blue fluorescent substance 517 (B) the bottom of the blue electrical discharge chamber 516 (B).

Next, transparent display electrodes 512 formed from a plurality of ITOs are formed on the glass substrates 502 in strips at a predetermined spacing, perpendicular to the address electrodes 511, and the bus electrodes 512a are formed from metal in order to compensate for the high resistance ITO. Furthermore, a dielectric layer 513 is formed over them, and a protective film 514 is formed from MgO.

The two substrates, the substrate 501 and the glass substrate 502, are then glued facing each other such that the address electrodes 511 and the display electrodes 512 cross perpendicular to each other, and the electrical discharge chambers 516 are formed by evacuating the air enclosed by the substrate 501 and the partitions 515, and the protective film 514 formed on the glass substrate 502 side, and then introducing rare gas. The display electrodes 512 formed on the glass substrate 502 side are formed in an arrangement such that there are two of them to each electrical discharge chamber 516.

The address electrodes 511 and the display electrodes 512 are connected to AC power, which is not shown in the figure, and by passing an electric current between the electrodes, it is possible to cause excitation-mission from the fluorescent substances 517 for color display at a required location in the electrical discharge display section 510.

In the present example, especially the address electrodes 511, the bus electrodes 512a and the fluorescent substances 517 are formed using the droplet discharge apparatus IJ. That is, especially because of the advantage in patterning, the address electrodes 511 and the bus electrodes 512a are formed by discharging liquid material (liquid) consisting of a dispersion of metal colloid material (for example, gold colloid and silver colloid) and conductive particles (for example, metal microparticles), and then drying and baking this. Furthermore, the fluorescent substances 517 are also formed by discharging liquid material (liquid) in which a fluorescent substance is held in solution or dispersed in a dispersion medium, and then drying and baking this.

In manufacturing this plasma display 500, prior to the discharge for forming the address electrodes 511, the bus electrodes 512a, and the fluorescent substances 517, by verifying the discharge operation of the discharge head 1 in advance, it is possible to discharge both the material (liquid material) for forming the electrodes 511 and 512a, and the material (liquid material) for forming the fluorescent substances 517, satisfactorily. Therefore, it is possible to improve the reliability of the plasma display 500 obtained.

Next is a description of a method of forming a conductive film wiring pattern (metal wiring pattern) as an example of forming the above-described system components.

Figure 11:
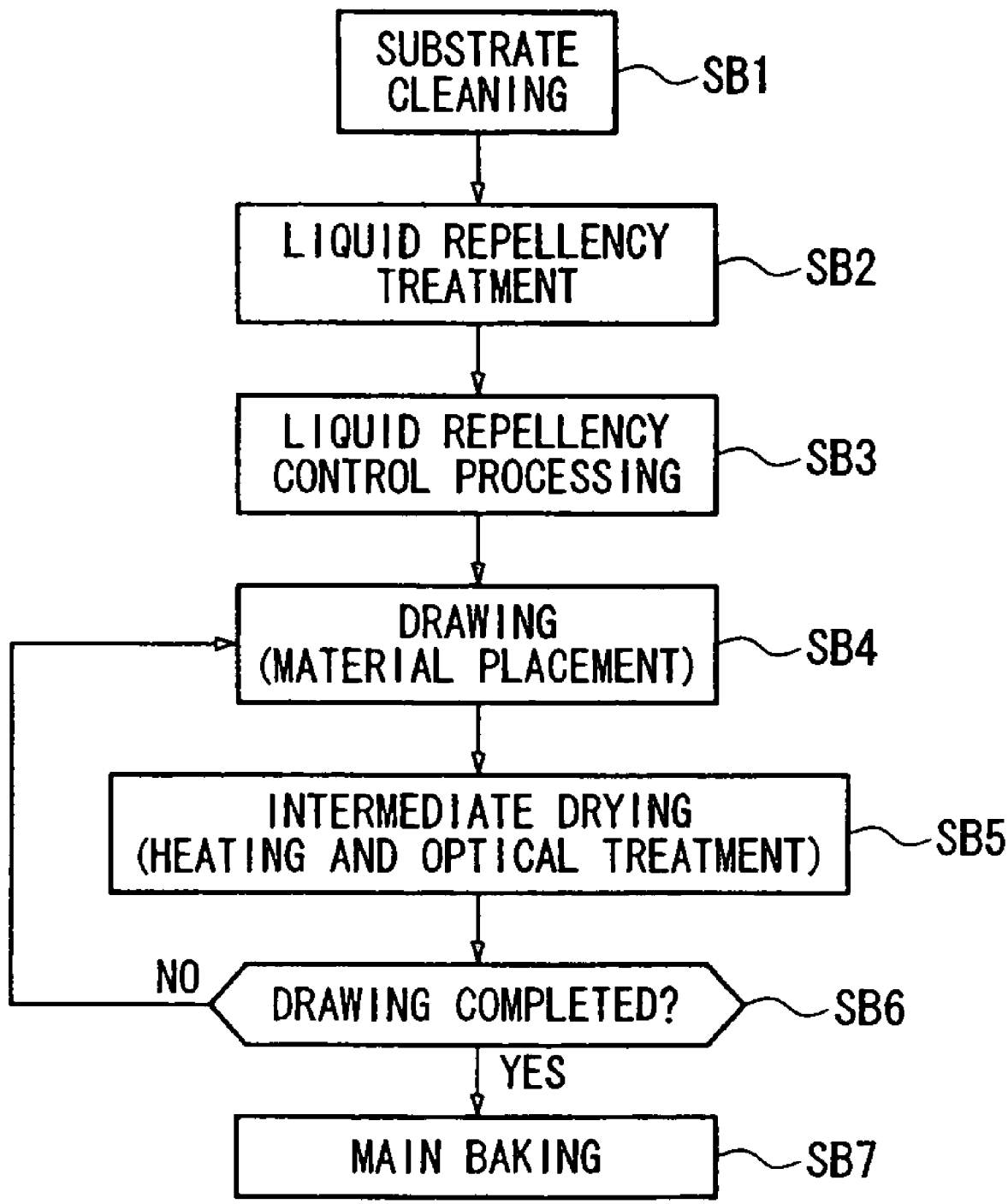
FIG. 11 is a flow chart for explaining a pattern forming method.

FIG. 11 is a flow chart showing an example of a method of forming a conductive film wiring pattern.

In FIG. 11, the method of forming a pattern according to the present example has a step (step SB1) for cleaning a substrate on which droplets of liquid material (liquid) are to be placed using a predetermined solvent or the like, a liquid repellency treatment step (step SB2) which comprises part of a substrate surface processing step, a liquid repellency control processing step (step SB3), which comprises part of a surface processing step, for adjusting the liquid sputtering of a substrate surface in which a liquid sputtering process is applied, a material placement step (step SB4) for placing droplets of liquid material containing conductive film wiring forming material on the surface treated substrate, based on the droplet discharge method to draw (form) a film pattern, an intermediate drying treatment step (step SB5) containing thermal and optical treatment which removes at least part of the solvent component of the liquid material placed on the substrate, and a baking step (step SB7) for baking the substrate on which a predetermined pattern is drawn. After the intermediate drying treatment step, it is determined whether the predetermined pattern drawing is completed (step SB6), and if the pattern drawing is completed, the baking step is performed. However, if the pattern drawing is not completed, the material placement step is performed.

Next is a description of the material placement step (step SB4) based on a droplet discharge method by means of the droplet discharge apparatus IJ.

The material placement step of the present example is a step for forming a plurality of line shaped film patterns (wiring patterns) side by side on the substrate P by placing droplets of liquid material containing conductive wire forming material on the substrate P from the droplet discharge head 1 of the droplet discharge apparatus IJ. The liquid material is a liquid in which conductive particles of metal or the like, being conductive wire film forming material, are dispersed in a dispersion medium. In the following description, a case is described in which first, second and third film patterns (line patterns), W1, W2 and W3 are formed on the substrate P.

FIG. 12, FIG. 13 and FIG. 14 are diagrams to describe an example of the order of arranging droplets on the substrate P in the present example. In the figures, a bitmap of pixels, being a plurality of grid shaped unit regions, where droplets of liquid material are placed, is arranged on the substrate P. Here, each square represents one pixel. First, second, and third pattern forming regions R1, R2 and R3, which form the first, second and third film patterns W1, W2 and W3, are arranged so as to correspond to predetermined pixels among the plurality of pixels. The plurality of pattern forming regions R1, R2 and R3 is arranged side by side in the X axis direction. In FIG. 12 to FIG. 14, the pattern forming regions R1, R2 and R3 are the hatched regions.

Furthermore, the arrangement is such that droplets of liquid material discharged from the first discharge nozzle 11A of the plurality of discharge nozzles provided on the discharge head 1 of the droplet discharge apparatus IJ are placed on the first pattern forming region R1 on the substrate P. Similarly, the arrangement is such that droplets of liquid material discharged from the second and third discharge nozzles 11B and 11C of the plurality of discharge nozzles provided on the discharge head 1 of the droplet discharge apparatus IJ are placed on the second and third pattern forming regions R2 and R3 on the substrate P respectively. That is, the discharge nozzles 11A, 11B and 11C are arranged so as to correspond to the first, second and third pattern forming regions R1, R2 and R3 respectively. The discharge head 1 places a plurality of droplets onto a plurality of pixels in the arranged plurality of pattern forming regions R1, R2 and R3 sequentially.

Moreover, the arrangement is such that in the first, second and third pattern forming regions R1, R2 and R3, the first, second and third film patterns W1, W2 and W3 to be formed in the pattern forming regions R1, R2 and R3 are formed starting with a first side pattern Wa on one side (−X side) in the line width direction, then a second side pattern Wb on the other side (+X side), and after forming the first and second side patterns Wa and Wb, a central pattern Wc.

In the present example, the film patterns (line patterns) W1 to W3, and the pattern forming regions R1 to R3, each have the same line width L, and this line width L is set to be the size of three pixels. Furthermore, the spacing between patterns is set to be the same width S, and this width S is also set to be the size of three pixels. The nozzle pitch, being the spacing between the discharge nozzles 11A to 11C, is set to be the size of six pixels.

In the following description, the discharge head 1 with discharge nozzles 11A, 11B and 11C discharges droplets while scanning the substrate P in the Y axis direction. In the description using FIG. 12 to FIG. 14, a droplet placed during a first scan is designated "1", and droplets placed during second, third, . . . , $n^{th}$ scans are designated "2", "3", . . . , "n" respectively.

Figure 12A:
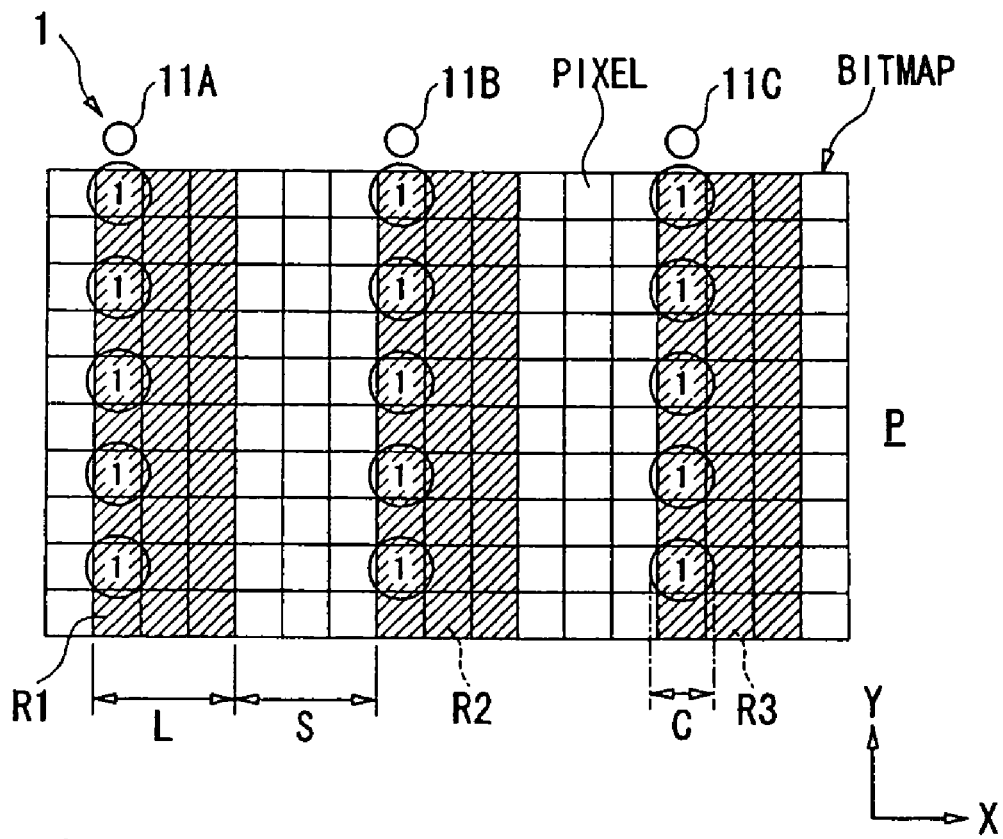
FIG. 12A and FIG. 12B are schematic diagrams showing an example of a pattern forming method.

As shown in FIG. 12A, in the first scan, droplets are placed from the first, second and third discharge nozzles 11A, 11B and 11C at the same time in the predetermined first side pattern forming regions in order to form the first side patterns Wa on the first, second and third pattern forming regions R1, R2 and R3, with a one pixel gap between droplets. When droplets are discharged from the discharge nozzles 11A, 11B and 11C, the discharge operation of the discharge head 1 is verified in advance prior to the discharge. Here, the droplets placed on the substrate P spread out over the substrate P when they reach the substrate P. That is, as shown by the circles in FIG. 12A, droplets landing on the substrate P spread out to have a diameter C larger than one pixel. Since the droplets are placed at a predetermined spacing (one pixel spacing) in the Y axis direction, the droplets on the substrate P are placed so as not to overlap. By so doing, it is possible to avoid applying excessive liquid material onto the substrate P in the Y axis direction, thus preventing bulges from occurring.

In FIG. 12A, the droplets are arranged so as not to overlap each other when placed on the substrate P. However, the arrangement may be such that the droplets are overlapped slightly. Furthermore, the droplets are placed with a one pixel gap between them. However, the droplets may be placed with a gap of any desired number of two or more pixels. In this case, the number of scanning operations and placement operations (discharge operations) of the discharge head 1 on the substrate P may be increased to fill in the droplets on the substrate.

Moreover, since the surface of the substrate P is treated to be liquid repellent as required by steps SB2 and SB3, excess spreading of droplets placed on the substrate P is suppressed. As a result, it is possible to maintain a satisfactory pattern shape reliably, and it is also easy to form thick films.

Figure 12B:
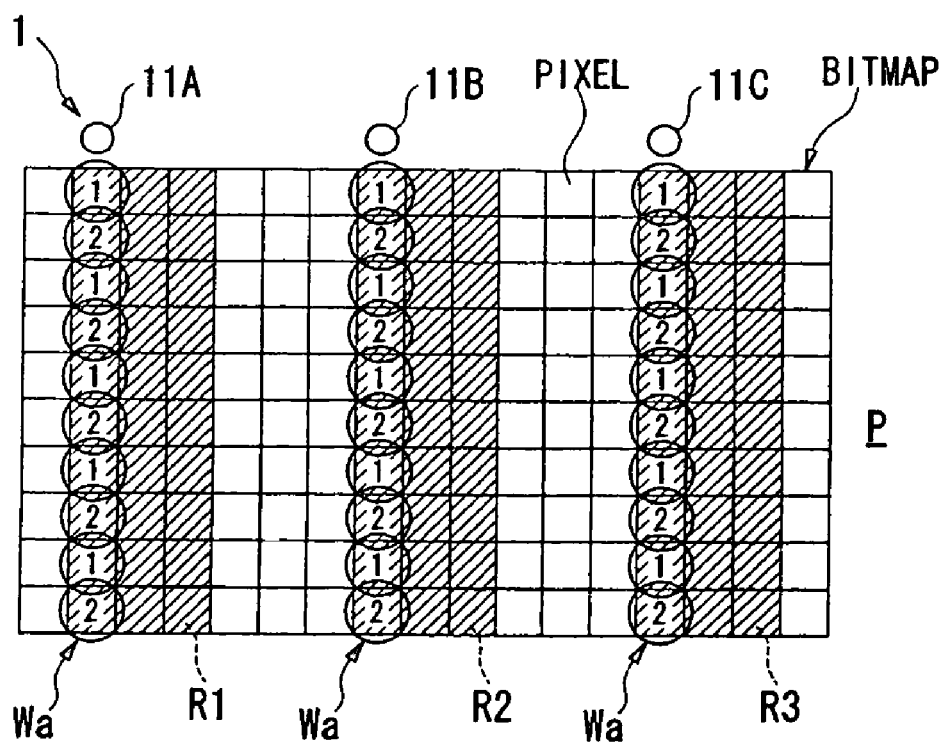

FIG. 12B is a schematic diagram when droplets are placed on the substrate P from the discharge head 1 in a second scan. In FIG. 12B, droplets placed during the second scan are designated "2". During the second scan, droplets are placed by the discharge nozzles 11A, 11B and 11C at the same time so as to interpose between the droplets "1" placed during the first scan. The droplets from the first and second scans and placement operations merge together to form first side patterns Wa in the first, second and third pattern forming regions R1, R2 and R3. Here, the droplets "2" also spread out when they land on the substrate P, and parts of the droplets "2" and parts of the droplets "1" placed on the substrate P previously overlap. To be specific, parts of the droplets "2" overlap the droplets "1". In addition, during the second scan, when discharging droplets from the discharge nozzles 11A, 11B and 11C, the discharge operation of the discharge head 1 can be verified in advance prior to the discharge.

In order to remove the dispersion medium after placing the droplets for forming the first side patterns Wa on the substrate P, it is possible to perform an intermediate drying process (step SB5) as required. The intermediate drying process may be an optical process using lamp anneal, as well as typical heating treatment using a heating system such as a hot plate, an electric furnace, a hot gas generator, or the like.

Figure 13A:
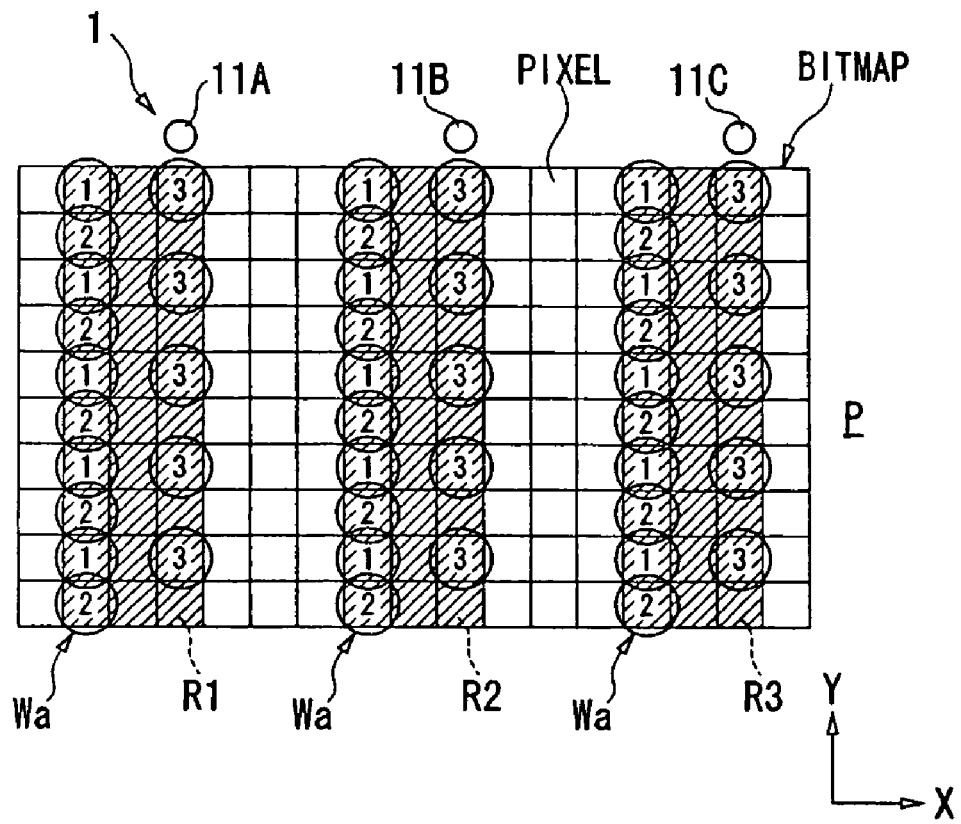
FIG. 13A and FIG. 13B are schematic diagrams showing an example of a pattern forming method.

Next, the discharge head 1 and the substrate P move relative to each other in the X axis direction by the size of two pixels. Here, the discharge head 1 is stepped in the +X direction by two pixels with respect to the substrate P. At the same time, the discharge nozzles 11A, 11B and 11C move. Then, the discharge head 1 performs a third scan. As a result, as shown in FIG. 13A, droplets "3" for forming second side patterns Wb, forming parts of the film patterns W1, W2 and W3, are placed on the substrate P by the discharge nozzles 11A, 11B and 11C at the same time with a gap from the first side patterns Wa in the X axis direction. The droplets "3" are also placed with a gap of one pixel in the Y axis direction. In addition, during the third scan, when discharging droplets from the discharge nozzles 11A, 11B and 11C, the discharge operation of the discharge head 1 can be verified in advance prior to the discharge.

Figure 13B:
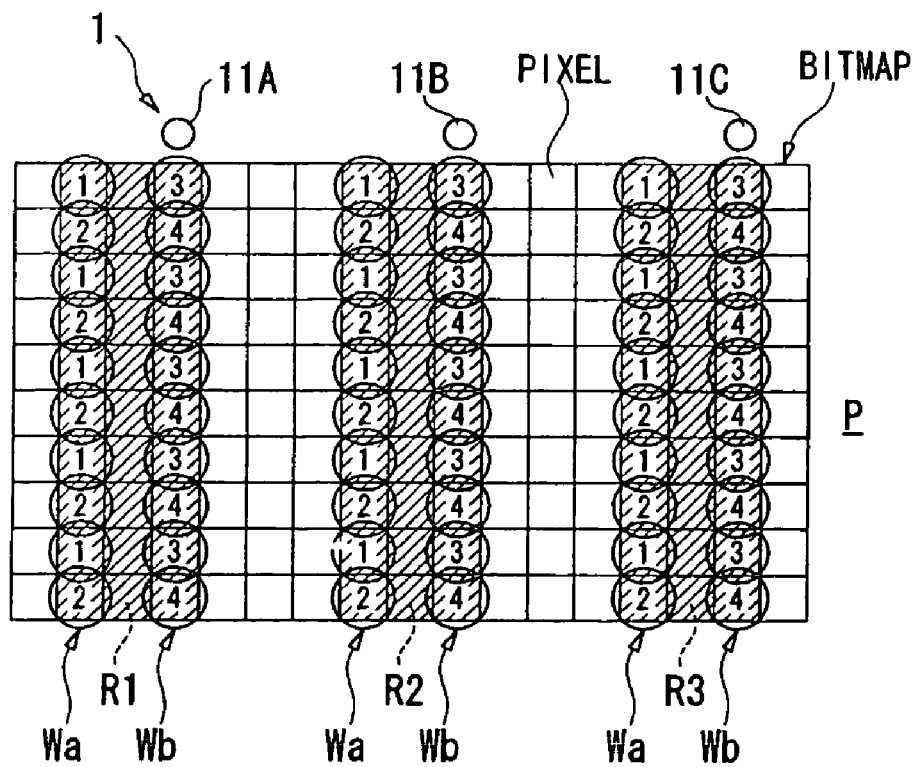

FIG. 13B is a schematic diagram when droplets are placed on the substrate P from the discharge head 1 in a fourth scan. In FIG. 13B, droplets placed during the fourth scan are designated "4". During the fourth scan, droplets are placed by the discharge nozzles 11A, 11B and 11C at the same time so as to interpose between the droplets "3" placed during the third scan. The droplets from the third and fourth scans and placement operations merge together to form second side patterns Wb in the pattern forming regions R1, R2 and R3. Here, parts of the droplets "4", and parts of the droplets "3" placed on the substrate P previously overlap. To be specific, parts of the droplets "4" overlap the droplets "3". In addition, during the fourth scan, when discharging droplets from the discharge nozzles 11A, 11B and 11C, the discharge operation of the discharge head 1 can be verified in advance prior to the discharge.

Here also, in order to remove the dispersion medium after placing the droplets for forming the second side patterns Wb on the substrate P, it is possible to perform an intermediate drying process as required.

Figure 14A:
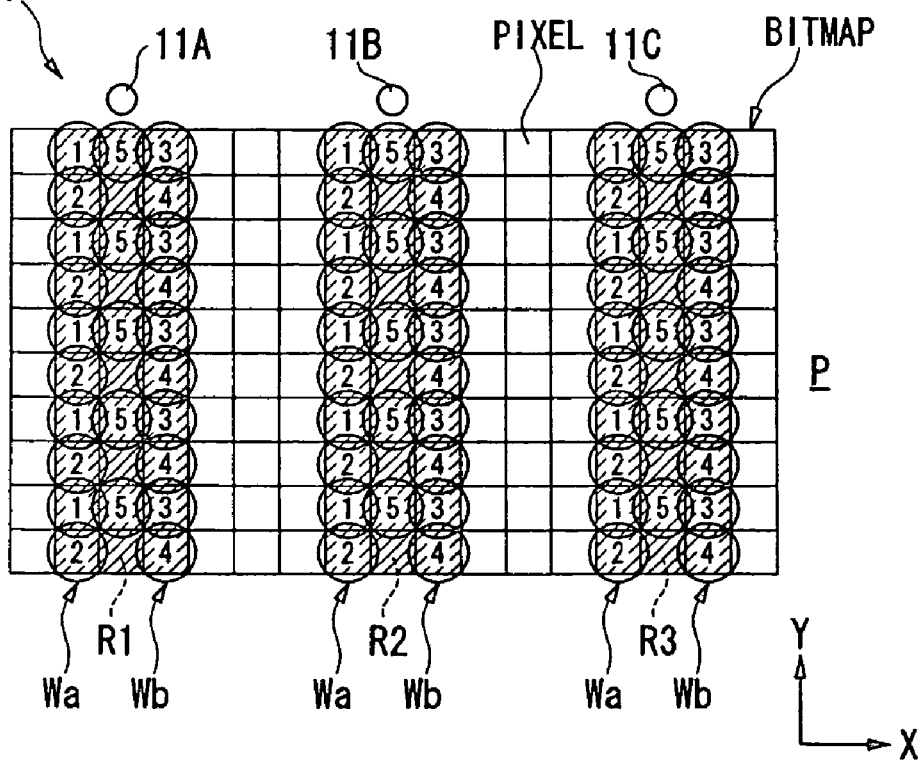
FIG. 14A and FIG. 14B are schematic diagrams showing an example of a pattern forming method.

Next, the discharge head 1 is stepped in the −X direction by one pixel with respect to the substrate P, and at the same time, the discharge nozzles 11A, 11B and 11C move in the −X direction by one pixel. Then, the discharge head 1 performs a fifth scan. As a result, as shown in FIG. 14A, droplets "5" for forming central patterns Wc, forming parts of the film patterns W1, W2 and W3, are placed on the substrate at the same time. Here, parts of the droplets "5" and parts of the droplets "1" and "3" placed on the substrate P previously overlap. To be specific, parts of the droplets "5" overlap the droplets "1" and "3". In addition, during the fifth scan, when discharging droplets from the discharge nozzles 11A, 11B and 11C, the discharge operation of the discharge head 1 can be verified in advance prior to the discharge.

Figure 14B:
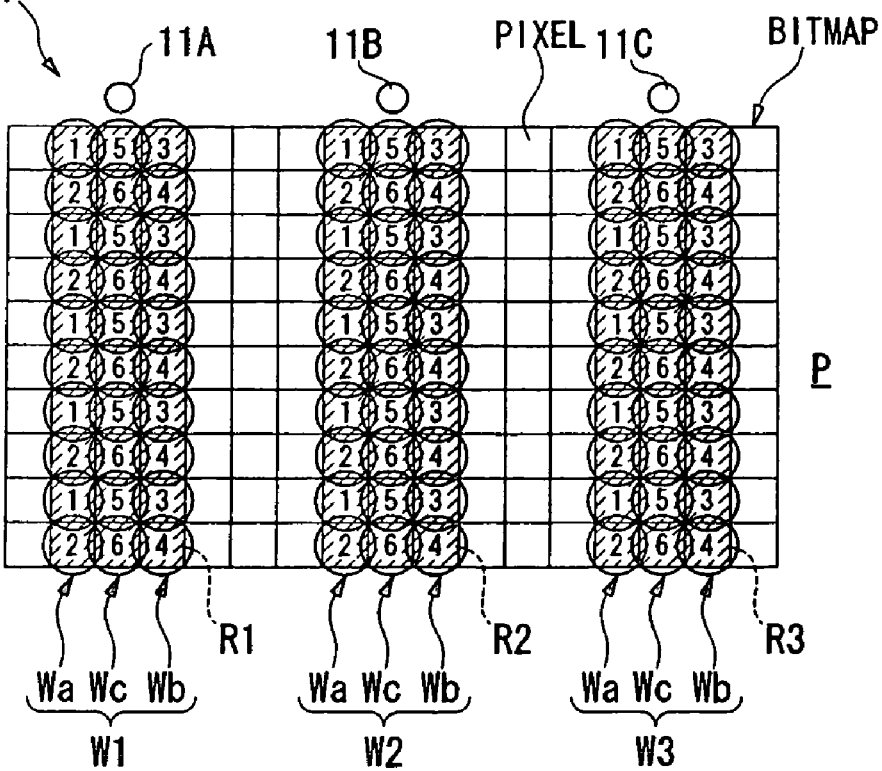

FIG. 14B is a schematic diagram when droplets are placed on the substrate P from the discharge head 1 in a sixth scan. In FIG. 14B, droplets placed during the sixth scan are designated "6". During the sixth scan, droplets are placed by the discharge nozzles 11A, 11B and 11C at the same time so as to interpose between the droplets "5" placed during the fifth scan. The droplets from the fifth and sixth scans and placement operations merge together to form central side patterns Wc in the pattern forming regions R1, R2 and R3. Here, parts of the droplets "6" and parts of the droplets "5" placed on the substrate P previously overlap. To be specific, parts of the droplets "6" overlap the droplets "5". Furthermore, parts of the droplets "6" overlap the droplets "2" and "4" placed on the substrate P previously. In addition, during the sixth scan, when discharging droplets from the discharge nozzles 11A, 11B and 11C, the discharge operation of the discharge head 1 can be verified in advance prior to the discharge.

As above, the film patterns W1, W2 and W3 are formed in the pattern forming regions R1, R2 and R3.

As described above, when placing a plurality of droplets sequentially in the pattern forming regions R1, R2 and R3 to form almost identically shaped film patterns W1, W2 and W3, since the order of placing droplets in the plurality of pixels of the pattern forming regions R1, R2 and R3 is set to be the same, then even in the case where the droplets "1" to "6" are placed so as to overlap parts of each other, the shapes of the overlaps in the film patterns W1, W2 and W3 are identical. Therefore, it is possible to make the appearance of the film patterns W1, W2 and W3 identical. Accordingly, it is possible to prevent the occurrence of unevenness in appearance between the film patterns W1, W2 and W3.

Moreover, since the placement order of droplets is the same in the film patterns W1, W2 and W3, the arrangements of droplets (overlapping shapes among droplets) in the film patterns W1, W2 and W3 are identical. Hence it is possible to prevent the occurrence of unevenness in appearance.

Furthermore, since the overlapping states between the film patterns W1, W2 and W3 are set to be the same, it is possible to make the film thickness distribution of the film patterns almost the same. Accordingly, in a case where this film pattern is a repeating pattern that repeats across the surface of the substrate, to be specific, in a case where a plurality of patterns is provided corresponding to pixels in a display device, the pixels have the same film thickness distribution. Accordingly, it is possible for locations across the surface of the substrate to exhibit the same functionality.

Moreover, since the droplets "5" and "6" for forming the central patterns Wc are placed after forming the first and second side patterns Wa and Wb so as to fill up the spaces between them, it is possible to form the line width of the film patterns W1, W2 and W3 almost uniformly. That is, in a case where the droplets "1", "2", "3" and "4" for forming the side patterns Wa and Wb are placed after forming the central patterns Wc on the substrate P, a phenomena occurs whereby these droplets are drawn toward the central patterns Wc formed on the substrate P previously. Therefore there is a case in which the line widths of the film patterns W1, W2 and W3 are difficult to control. However, since the droplets "5" and "6" for forming central patterns Wc are placed after forming the side patterns Wa and Wb on the substrate P previously, so as to fill up the spaces between them as in the present embodiment, it is possible to control the line width of the film patterns W1, W2 and W3 accurately.

The side patterns Wa and Wb may be formed after forming the central patterns Wc. In this case, by using the same placement order of droplets for the film patterns W1, W2 and W3, it is possible to prevent the occurrence of unevenness in appearance.

When forming a conductive wire film pattern (metal wire pattern) in this way, by verifying the discharge operation of the discharge head 1 in advance prior to discharge, droplets can be discharged satisfactorily. Thus it is possible to improve the reliability of the conductive wire pattern obtained.

Next is a description of a method of manufacturing a microlens as an example of forming a system component.

In the present example, as shown in FIG. 15A, a droplet 622a formed from a light transmissive resin is applied by discharge onto a substrate P from the discharge head 1 of the droplet discharge apparatus IJ. When the droplet 622a is discharged from the discharge head 1, the discharge operation of the discharge head 1 is verified in advance prior to the discharge.

In the case where the microlens to be obtained is used for an optical film for a screen for example, the substrate P may be a light transmissive sheet or light transmissive film, formed from a cellulose resin such as cellulose acetate, propylcellulose, or the like, or a transparent resin (light transmissive resin) such as polyvinyl chloride, polyethylene, polypropylene, polyester, or the like. Furthermore, a substrate formed from transparent material (light transmissive material) such as glass, polycarbonate, polyalylate, polyether sulphone, amorphous polyolefin, polyethylene terephthalate, polymethyl methacrylate, or the like, can also be used as a substrate.

A light transmissive resin may be an acrylic resin such as polymethyl methacrylate, polyhydroxy ethyl methacrylate, poly cyclohexyl methacrylate, or the like, an allyl resin such as polydiethyleneglycol bis allyl carbonate, polycarbonate, or the like, or thermoplastic or thermosetting resin such as methacrylic resin, polyurethane resin, polyester resin, polyvinyl chloride resin, polyvinyl acetate resin, cellulose resin, polyamide resin, fluororesin, polypropylene resin, or polystyrene resin. Either one of these types may be used, or a plurality of these types may be mixed for use.

However, in the present example, specifically, a radiated light irradiation curing type is used for the light transmissive resin. This radiated light irradiation curing type is a combination of a light transmissive resin and a photoinitiator such as biimidazole compound, or the like, and the irradiation curing characteristic is obtained by the combination with such a photoinitiator. Radiated light is a general name for visible light, ultraviolet light, far ultraviolet light, X-rays, an electron beam, and the like, and especially ultraviolet light is used typically.

Depending on the size of a desired single microlens, one or more droplets 622a of such irradiation curing type light transmissive resin are discharged onto a substrate P. Then, the light transmissive resin 623 formed from the droplets 622a becomes a convex shape (almost hemispherical) as shown in FIG. 15A due to its surface tension. In this manner, a predetermined amount of light transmissive resin is applied by discharge as a single microlens to be formed, and this coating process is repeated for the desired number of microlenses. Then a radiated light such as ultraviolet light or the like is radiated onto the light transmissive resin 623 to cure it as shown in FIG. 15B to form a hardened body 623a. Here, the capacity of the droplet 622a discharged from the discharge head 1 per drop depends on the discharge head 1 and the ink material to be discharged. However, normally it is approximately 1 pL to 20 pL.

Next, as shown in FIG. 15C, a desired number of droplets 622b, in which a large number of minute light diffusible particles 626 is dispersed, is discharged from the discharge head 1, and adheres to the surfaces of the hardened bodies 623a. The minute light diffusible particles include minute particles of silica, alumina, titania, calcium carbonate, aluminum hydroxide, acrylic resin, organic silicon resin, polystyrene, urea resin, formaldehyde condensation product, and the like, and one or a plurality of these types is used. However, in order for the minute light diffusible particles 626 to exhibit sufficient light diffusivity, in the case where the minute particles are optically transparent, it is necessary to have a sufficient difference between their refractive index and the refractive index of the light transmissive resin mentioned previously. Accordingly, in the case where the minute light diffusible particles 626 are optically transparent, appropriate ones are selected for use based on the light transmissive resin to be used so as to satisfy such a condition.

Such minute light diffusible particles 626 are prepared as an ink capable of being discharged from the discharge head 1, by being dispersed in an appropriate solvent (for example, a solvent used for light transmissive resin) in advance. At this time, it is desirable that dispersion of the minute light diffusible particles 626 in the solvent is improved by coating the surface of the minute light diffusible particles 626 with a surface active agent, or by coating them with a molten resin. By performing such treatment, it is possible to add flowability to the minute light diffusible particles 626, which aids good discharge from the discharge head 1. As a surface active agent for the surface treatment, one such as cationic system, an anionic system, a nonionic system, an amphoteric, a silicon system, a fluororesin system or the like, is appropriately selected for use based on the type of minute light diffusible particles 624.

Furthermore, it is desirable to use minute light diffusible particles 626 with a particle size of greater than or equal to 200 nm and less than or equal to 500 nm. This is because in such a range, the optical transparency can be maintained satisfactorily by a particle size of 200 nm or greater, and it can be discharged from nozzles of the discharge head 1 satisfactorily by being 500 nm or less.

The same discharge head 1 as the one that discharges the droplet 622a of light transmissive resin may be used to discharge the droplets 622b in which minute light diffusible particles 626 are dispersed, or a different one may be used. In the case where the same one is used, it is possible to simplify the construction of the apparatus containing the discharge head 1. On the other hand, in the case where a different one is used, since each ink (ink formed from light transmissive resin and ink formed from minute light diffusible particles 624) uses its own head, it is not necessary to clean the heads or the like when changing the inks to be coated, thus enabling the productivity to be improved.

Afterwards, by performing heating treatment, decompression treatment, or heat and decompression treatment, the solvent in a droplet 622b, in which minute light diffusible particles 624 are dispersed, is evaporated. By so doing, the surface of the hardened body 623a is softened by the solvent in the droplet 622b, and since the minute light diffusible particles 626 are adhered to this, the minute light diffusible particles 624 are fixed onto the surface of the hardened body 623a of light transmissive resin as the solvent evaporates and the surface of the hardened body 623a is hardened again. By fixing the minute light diffusible particles 624 onto the surface of the hardened body 623a in this manner, it is possible to obtain a microlens 625 of the present invention, formed by dispersing the minute light diffusible particles 624 on the surface as shown in FIG. 15D.

In such a method of manufacturing a microlens 625, it is also possible to discharge the droplets 622a and 622b satisfactorily by verifying the discharge operation of the discharge head 1 in advance, prior to the discharge. Accordingly, it is possible to improve the reliability of the microlens 625 obtained.

Furthermore, since the convex shape (almost hemispherical) microlens 625 is formed from the light transmissive resin 623 and the minute light diffusible particles 624 using an ink jet method, no forming mold is required as in the case of using a metal pattern molding process or an injection molding process, and there is also less loss of material. Accordingly, it is possible to achieve a reduction in the manufacturing cost. Moreover, since the microlens to be obtained is a convex shape (almost hemispherical), by using this microlens it is possible to disperse light almost evenly over a wide angle range (direction) of 360° for example. Furthermore, since minute light diffusible particles 626 are incorporated, it is possible to obtain a microlens with high diffusivity.

Next is a description of a method of manufacturing an image display device with an electron emitting element as an example of forming a system component.

Figure 16A:
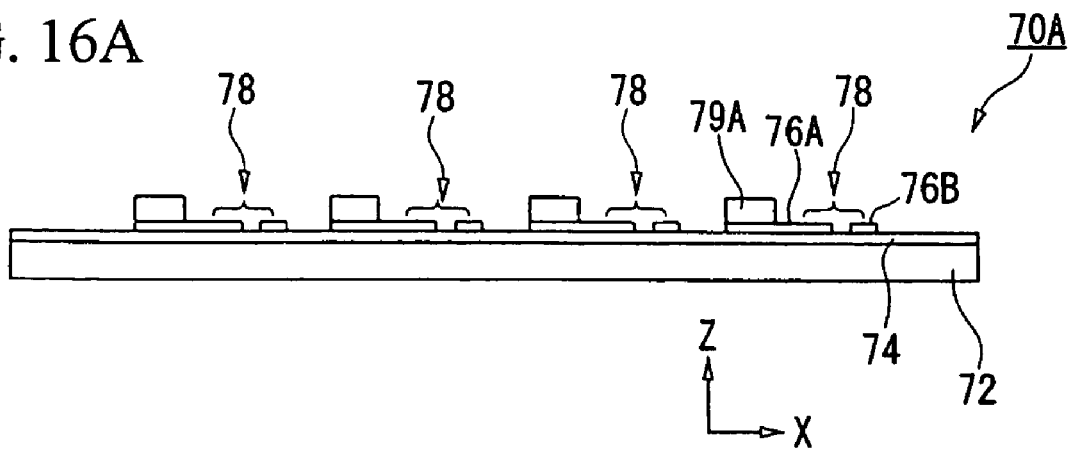
FIG. 16A and FIG. 16B are schematic diagrams of an electron source substrate of an image display device.
Figure 16B:
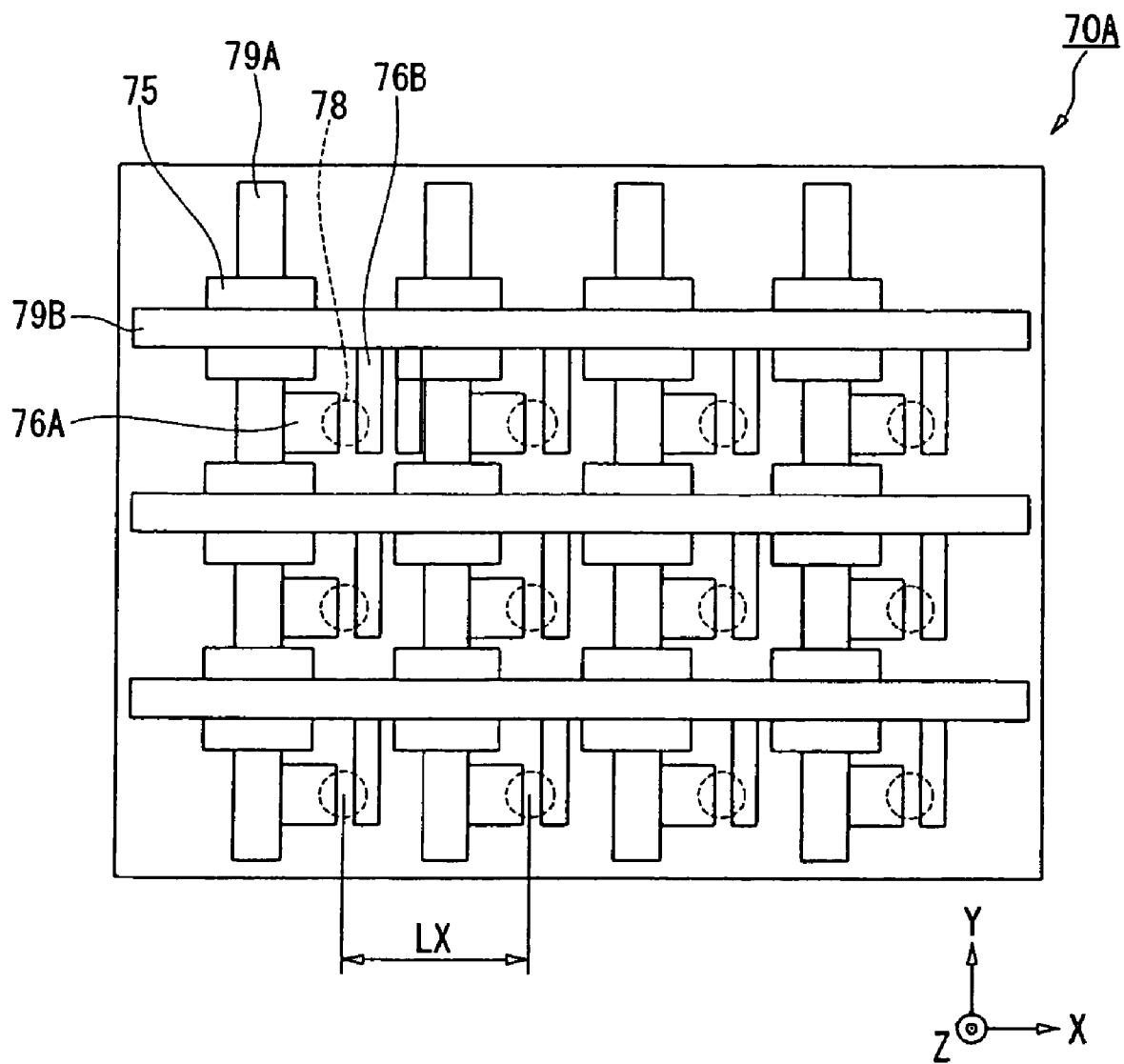

A substrate 70A as shown in FIG. 16A and FIG. 16B is to be made into an electron source substrate 70B of an image display device in which some of the system components are formed by a process using the above-described droplet discharge apparatus IJ. The substrate 70A has a plurality of discharge target sections 78, arranged in a matrix.

To be specific, the substrate 70A has a substrate 72, a sodium diffusion prevention layer 74, a plurality of device electrodes 76A and 76B, a plurality of metal wires 79A located on the plurality of device electrodes 76A, and a plurality of metal wires 79B located on the plurality of device electrodes 76B. The shapes of each of the plurality of metal wires 79A extend in the Y axis direction. The shapes of each of the plurality of metal wires 79B extend in the X axis direction. Since insulating films 75 are formed between the metal wires 79A and the metal wires 79B, the metal wires 79A and the metal wires 79B are electrically insulated.

Parts containing a pair of a device electrode 76A and a device electrode 76B correspond to one pixel region. The device electrode 76A and device electrode 76B in a pair oppose each other on the sodium diffusion prevention layer 74, with a predetermined distance therebetween. A device electrode 76A corresponding to a particular pixel region is connected electrically with a corresponding metal wire 79A. Furthermore, a device electrode 76B corresponding to the pixel region is connected electrically with a corresponding metal wire 79B. In the present specification, the part comprising the combination of the substrate 72 and the sodium diffusion prevention layer 74 may be designated a support substrate.

In each of the pixel regions of the substrate 70A, part of the device electrode 76A, part of the device electrode 76B, and the sodium diffusion prevention layer 74 exposed between the device electrode 76A and the device electrode 76B correspond to a discharge target section 78. To be more specific, the discharge target section 78 is a region where a conductive thin film 411F (refer to FIG. 17B) is to be formed, and the conductive thin film 411F is formed such that it covers part of the device electrode 76A, part of the device electrode 76A, and the gap between the device electrodes 76A and 76B. As shown by broken lines in FIG. 16B, the discharge target section 78 in the present example is circular.

The substrate 70A shown in FIG. 16B is positioned parallel to an imaginary plane defined by the X axis direction and the Y axis direction. The line writing direction and the column-wise direction of the matrices formed by a plurality of discharge target sections 78 are parallel to the X axis direction and the Y axis direction respectively. In the substrate 70A, the discharge target sections 78 are arranged side by side at intervals in this order in the X axis direction. Furthermore, the discharge target sections 78 are arranged side by side at a predetermined spacing in the Y axis direction.

The spacing LX between the discharge target sections 78 in the X axis direction is approximately 190 µm. The spacing between the discharge target sections 78 and the above-described size of the discharge target section correspond to the spacing between pixel regions in an approximately 40 inch high-vision television.

The droplet discharge apparatus IJ discharges conductive thin film material 411 as liquid material (liquid) onto each of the discharge target sections 78 of the substrate 70A in FIG. 16A and FIG. 16B. An organic palladium solution is used for this conductive thin film material 411, for example.

In order to manufacture an image display device using the droplet discharge apparatus IJ, firstly, the sodium diffusion prevention layer 74 whose main component is silicon dioxide ($SiO_2$) is formed on the substrate 72 formed from soda glass. To be specific, the sodium diffusion prevention layer 74 is obtained by forming a 1 µm thick $SiO_2$ film on the substrate 72 using a sputtering technique. Next, a titanium layer with a thickness of 5 nm is formed on the sodium diffusion prevention layer 74 by a sputtering technique or a vacuum evaporation method. Then, a plurality of pairs of device electrodes 76A and device electrodes 76B is formed from the titanium layer, with a predetermined distance therebetween, using a photolithographic technique and an etching method. Afterwards, a plurality of metal wires 79A extending in the Y axis direction is formed by coating and then baking silver (Ag) paste onto the sodium diffusion prevention layer 74 and the plurality of device electrodes 76A using a screen printing technique. Next, an insulating film 75 is formed by coating and baking a glass paste onto a part of each of the metal wires 79A using a screen printing technique. Then, a plurality of metal wires 79B extending in the X axis direction is formed by coating and baking Ag paste onto the sodium diffusion prevention layer 74 and the plurality of device electrodes 76B using a screen printing technique. In the case of manufacturing the metal wires 79B, Ag paste is coated such that the metal wires 79B cross the metal wires 79A via the intervening insulating film 75. The substrate 70A as shown in FIG. 16A and FIG. 16B is obtained using the process described above.

Next, the substrate 70A is made to be lyophilic by an oxygen plasma process under atmospheric pressure. This process makes part of the surface of the device electrodes 76A, part of the surface of the device electrodes 76B, and the surface of the exposed support substrate between the device electrodes 76A and the device electrodes 76B lyophilic. Then, the surfaces become the discharge target sections 78. In addition, a surface that exhibits the desired lyophilic properties could be obtained without the above-described surface processing, depending on the material. In such a case, part of the surface of the device electrodes 76A, part of the surface of the device electrodes 76B, and the surface of the exposed support substrate between the device electrodes 76A and the device electrodes 76B become the discharge target sections 78 without performing the surface processing.

Figure 17A:
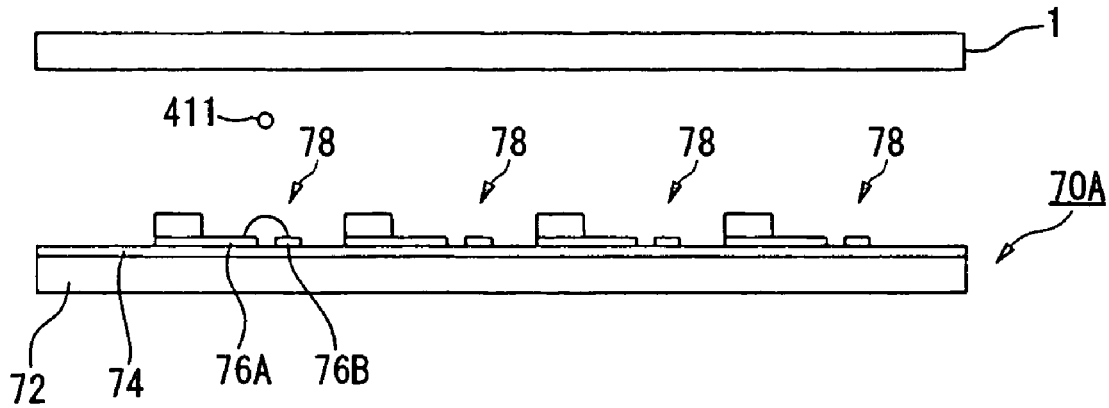
FIG. 17A to FIG. 17C are diagrams for explaining the manufacturing process of the image display device.

The substrate 70A on which the discharge target sections 78 are formed is carried to a stage of the droplet discharge apparatus IJ by a carrier. Then, as shown in FIG. 17A, the droplet discharge apparatus IJ discharges a conductive thin film material 411 from a discharge head 1 so as to form a conductive thin film 411F on the discharge target sections 78. Here, when discharging the conductive thin film material 411, the discharge operation of the discharge head 1 is verified in advance prior to the discharge.

In the present example, discharge is performed from the discharge head 1 such that the diameter of the droplets of the conductive thin film material 411 landing on the discharge target sections 78 are within a range of 60 µm to 80 µm. When a layer of a conductive thin film material 411 is formed on all the discharge target sections 78 of the substrate 70A, the carrier places the substrate A in a drying device. Then, a conductive thin film 411F, whose main component is palladium oxide, is obtained on the discharge target sections 78 by drying the conductive thin film material 411 on the discharge target sections 78. In this manner, a conductive thin film 411F, which covers part of the surface of the device electrodes 76A, part of the surface of the device electrodes 76B, and the surface of the exposed support substrate between the device electrodes 76A and the device electrodes 76B, is formed in each of the pixel regions.

Next, electron emission sections 411D are formed on part of the conductive thin film 411F by applying a predetermined, pulsed voltage between the device electrodes 76A and the device electrodes 76B. Here it is preferable to apply a voltage between the device electrodes 76A and the device electrodes 76B under either an organic atmosphere or vacuum condition. This is because it increases the electron emission efficiency from the electron emission sections 411D. The device electrodes 76A, the corresponding device electrodes 76B, and the conductive thin film 411F which is provided with the electron emission sections 411D, are electron emission elements. Furthermore, each electron emission element corresponds to a pixel region.

Figure 17B:
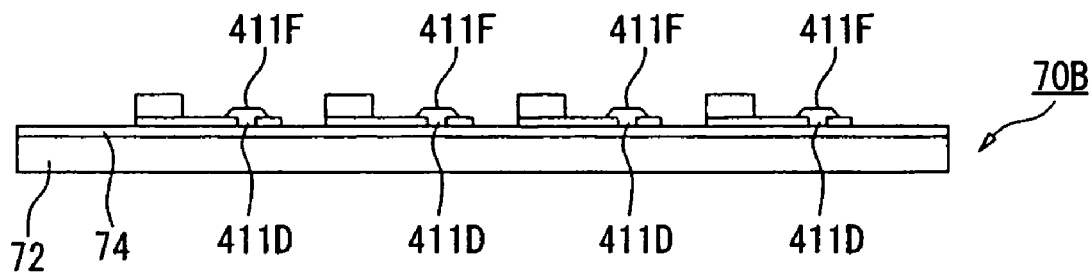

The substrate 70A becomes an electron source substrate 70B by the above process as shown in FIG. 17B.

Figure 17C:
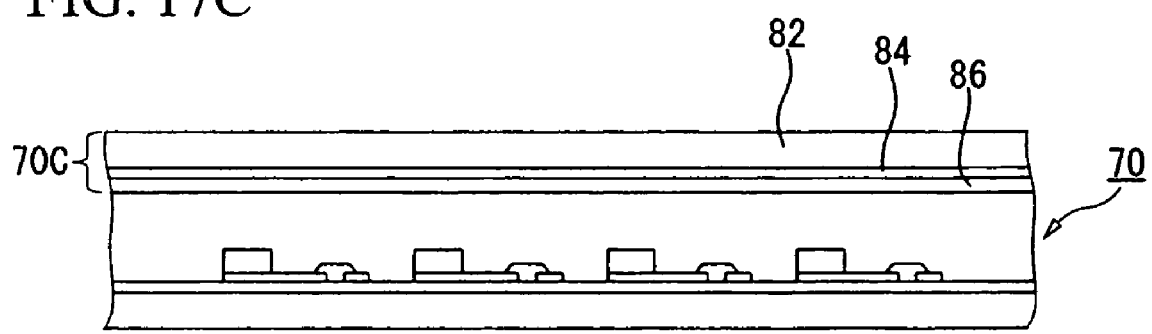

Next, as shown in FIG. 17C, an image display device 70 is obtained by bonding the electron source substrate 70B and a front substrate 70C by a known method. The front substrate 70C has a glass substrate 82, a plurality of fluorescent sections 84 positioned on the glass substrate 82 in a matrix pattern, and a metal plate 86 covering the plurality of fluorescent sections 84. The metal plate 86 functions as an electrode to accelerate electron beams from the electron emission sections 411D. The electron source substrate 70B and the front substrate 70C are positioned such that each of the plurality of electron emission elements faces one of the plurality of fluorescent sections 84. Furthermore, a vacuum condition is maintained between the electron source substrate 70B and the front substrate 70C.

In a method of manufacturing such an image display device with electron emission elements, it is also possible to discharge the conductive thin film material 411 satisfactorily by checking the discharge operation of the discharge head 1 in advance prior to the discharge. Thus it is possible to improve the reliability of the image display device obtained.

It is possible to manufacture electro-optical devices (devices) such as the above-described liquid crystal device, organic EL device and the like using the droplet discharge apparatus IJ of the present invention. Hereunder is a description of applied examples of electronic equipment incorporating electro-optical devices, which are manufactured by a device manufacturing apparatus IJ having a droplet discharge apparatus.

Figure 18A:
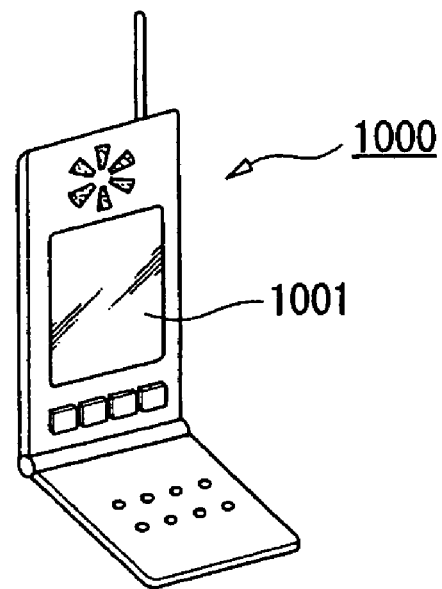
FIG. 18A to FIG. 18C are diagrams showing examples of electronic equipment in which these devices are installed.
Figure 18B:
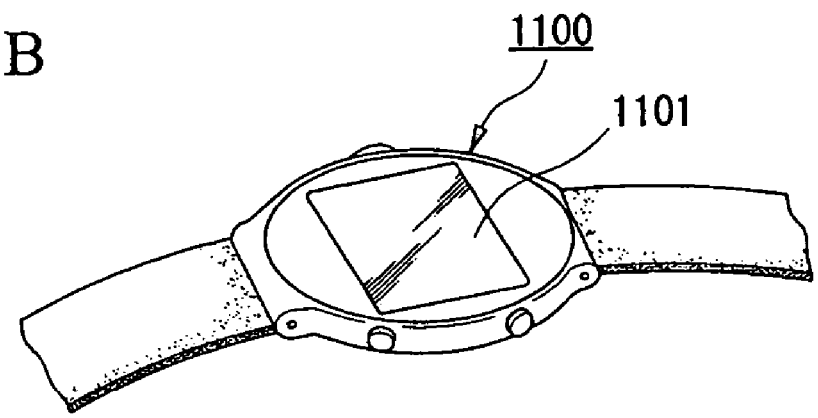
Figure 18C:
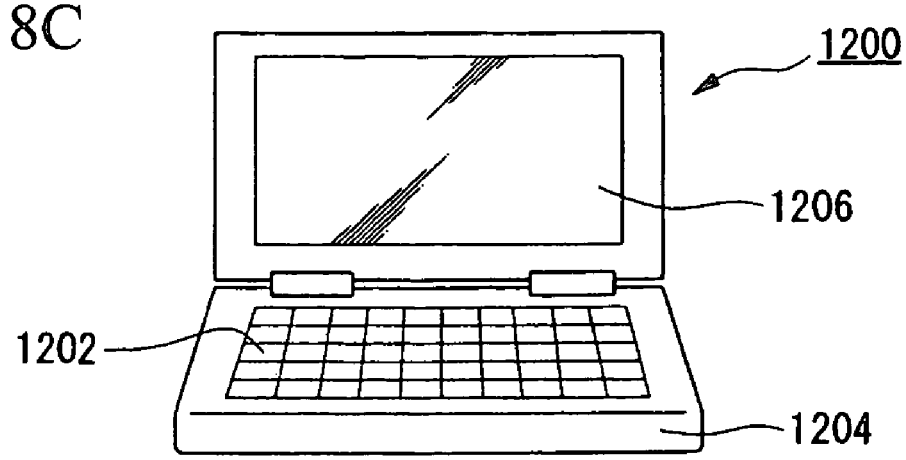

FIG. 18A is a perspective view showing an example of a mobile telephone. In FIG. 18A, numeral 1000 denotes a mobile telephone body, and numeral 1001 denotes a display panel in which the above-described electro-optical device is used. FIG. 18B is a perspective view showing an example of a watch type electronic equipment In FIG. 18B, numeral 1100 denotes a watch body, and numeral 1101 denotes a display panel using the above-described electro-optical device. FIG. 18C is a perspective view showing an example of portable type information processing equipment such as a word processor, a personal computer or the like. In FIG. 18C, numeral 1200 denotes the information processing equipment, numeral 1202 an input section such as a keyboard, numeral 1204 an information processing equipment body, and numeral 1206 a display panel using the above-described electro-optical device. Since the electronic equipment shown in FIG. 18A to FIG. 18C have electro-optical devices of the above-described embodiment, it is possible to realize electronic equipment having display panels with excellent display quality and bright screens.

In addition to the above examples, other examples are a liquid crystal television, viewfinder type and monitor direct-view type video tape recorders, a car navigation system, a pager, an electronic notebook, an electronic desk calculator, a word processor, a workstation, a video telephone, a point-of-sale terminal, electronic paper, equipment with a touch panel, and the like. An electro-optical device of the present invention can be used as a display panel of such electronic equipment.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A device manufacturing apparatus comprising:
   a discharge head for discharging a droplet containing a functional material;
   a stage for supporting a substrate on which said droplet is discharged, and which is capable of moving relative to said discharge head;
   a carrier for carrying said substrate;
   a detector for detecting a discharge condition of said droplet which is discharged from a discharge nozzle formed in said discharge head;
   a driving device for moving said discharge head with respect to said detector; and
   a controller for executing a detection operation by said detector during loading and unloading operations of said substrate, said loading and unloading operations being made by replacing a first substrate being the substrate currently supported on the stage with a second substrate being another substrate currently not supported on the stage, wherein
   said detector and said stage are provided at different locations;
   said detector includes a light emitter for emitting a detection light, and a receiver for receiving said detection light emitted from said light emitter;
   said receiver determines whether said liquid droplet is being discharged from said discharge nozzle, based on changes in the intensity of said detection light received by said receiver due to said liquid droplet passing through the optical path of said detection light; and
   said controller performs calibration of said receiver immediately before execution of a nozzle detection operation so as to consider a current condition of said receiver and current influences on said receiver of circumstances surrounding said receiver, said calibration including resetting of a gain data at present of said receiver.

2. A device manufacturing apparatus according to claim 1, further comprising
   a recovery unit for performing a recovery operation of said discharge nozzle.

3. A device manufacturing apparatus according to claim 2, wherein said controller performs said recovery operation corresponding to detection results of said detector, and reexecutes detection a predetermined number of times.

4. A device manufacturing apparatus according to claim 1, further comprising
   a display device for displaying detection results of said detector, and an error based on the detection results.

5. A device manufacturing apparatus according to claim 1, wherein said discharge head is two or more.

6. A device manufacturing apparatus according to claim 1, wherein said device is at least one of; a liquid crystal element, an organic electroluminescent element, a plasma display element, an electron emission element, an optical element and a conductive film element.

7. A device manufacturing method comprising:
   a step of discharging a droplet containing a functional material onto a substrate by means of a discharge nozzle in a discharge head;
   a carrying step of loading and unloading said substrate;
   a step of moving said discharge nozzle from a first position at which said step of discharging said droplet is carried out, to a second position at which an operation for detecting a discharge condition of said droplet which is discharged from said discharge nozzle is carried out, during said carrying step; and
   a detection step of detecting said discharge condition, during said carrying step in which a first substrate being the substrate currently positioned at the first position is replaced with a second substrate being another substrate currently not positioned on the first position, wherein
   said detection step of detecting said discharge condition includes the steps of emitting detection light towards a receiver, and determining whether said liquid droplet is being discharged from said discharge nozzle, based on changes in the intensity of said detection light received by said receiver due to said liquid droplet passing through the optical path of said detection light, and wherein calibration of said receiver is performed immediately before execution of a nozzle detection operation so as to consider a current condition of said receiver and current influences on said receiver of circumstances surrounding said receiver, said calibration including resetting of a gain data at present of said receiver.

8. A device manufacturing method comprising:

loading a first substrate onto a stage;

discharging droplets onto the first substrate from a nozzle in a discharge head;

unloading said first substrate from the stage and treating the droplets to form a structure on the substrate; and during the loading of a second substrate not positioned on the stage, onto the stage or unloading of the first substrate positioned on the stage, testing the discharge head by passing droplets therefrom through a light beam, wherein said testing of the discharge head includes the steps of:

emitting detection light towards a receiver; and determining whether said droplets are being discharged from said nozzle, based on changes in the intensity of said light beam received by said receiver due to said droplets passing through the optical path of said light beam, and wherein calibration of said receiver is performed immediately before execution of a nozzle detection operation so as to consider a current condition of said receiver and current influences on said receiver of circumstances surrounding said receiver, said calibration including reselling of a gain data at present of said receiver.

* * * * *